(12) United States Patent
Sonobe

(10) Patent No.: US 7,532,250 B2
(45) Date of Patent: May 12, 2009

(54) CLOCK GENERATION APPARATUS

(75) Inventor: Hiroshi Sonobe, Mishima-gun (JP)

(73) Assignee: Panasonic Corporation, Osaka (JP)

( * ) Notice: Subject to any disclaimer, the term of this patent is extended or adjusted under 35 U.S.C. 154(b) by 8 days.

(21) Appl. No.: 11/712,946

(22) Filed: Mar. 2, 2007

(65) Prior Publication Data

US 2007/0153126 A1 Jul. 5, 2007

Related U.S. Application Data

(62) Division of application No. 11/248,254, filed on Oct. 13, 2005, now abandoned.

(30) Foreign Application Priority Data

Oct. 13, 2004 (JP) ............................. 2004-299127

(51) Int. Cl.
*H03L 7/00* (2006.01)
(52) U.S. Cl. .................. 348/537; 348/541; 348/542
(58) Field of Classification Search ................ 348/572, 348/537–544, 549, 505, 508; 386/19, 20, 386/13, 17
See application file for complete search history.

(56) References Cited

U.S. PATENT DOCUMENTS

| 4,625,232 | A | * | 11/1986 | Nillesen ..................... 348/639 |
| 4,675,724 | A | * | 6/1987 | Wagner ....................... 348/498 |
| 4,689,664 | A | * | 8/1987 | Moring et al. .............. 348/639 |
| 4,700,217 | A | | 10/1987 | Balaban et al. |
| 4,847,678 | A | | 7/1989 | McCauley |
| 5,355,171 | A | * | 10/1994 | Miyazaki et al. ............ 348/505 |
| 5,557,335 | A | * | 9/1996 | Oh ............................. 348/512 |
| 6,052,152 | A | * | 4/2000 | Malcolm et al. ........... 348/537 |
| 6,115,586 | A | * | 9/2000 | Bezzam et al. ............. 455/112 |
| 6,201,578 | B1 | | 3/2001 | Hosoya |
| 6,329,850 | B1 | * | 12/2001 | Mair et al. .................. 327/107 |
| 6,380,980 | B1 | * | 4/2002 | Huang ........................ 348/505 |
| 2003/0156670 | A1 | * | 8/2003 | Schoene et al. ............. 375/355 |

FOREIGN PATENT DOCUMENTS

JP 5-90958 4/1993

* cited by examiner

*Primary Examiner*—Victor R Kostak
(74) *Attorney, Agent, or Firm*—Wenderoth, Lind & Ponack, L.L.P.

(57) ABSTRACT

A clock generation apparatus is provided with a frequency phase error calculation circuit 120, whereby a clock synchronized with burst lock and a line lock clock can be simultaneously generated by a DTO 121 on the basis of frequency information of a DTO 10 and phase error information from a phase comparator 7 and a digital LPF 8. Therefore, the clock generation apparatus can cope with a system that required plural clocks, and frequency spread is easily carried out by generating spread information by a frequency spread information generation circuit 90, and adding it in the DTO 121. As a result, interference to a video terminal from the clock can be reduced, and performance of a video terminal such as a television receiver can be exploited.

2 Claims, 26 Drawing Sheets

CLOCK GENERATION APPARATUS

This application is a divisional of U.S. application Ser. No. 11/248,254, filed Oct. 13, 2005 now abandoned.

FIELD OF THE INVENTION

The present invention relates to a clock generation apparatus for generating a clock for operating a signal processing circuit of a television receiver and, more particularly, to a clock generation apparatus for generating a clock synchronized with an input video signal.

BACKGROUND OF THE INVENTION

In recent years, digitization of video signal processing and diversification of input sources of television receivers are progressing, and there is employed a clock generation apparatus which synchronizes a reference signal such as a horizontal sync signal of a video signal with a clock for video signal processing.

Hereinafter, a conventional clock generation apparatus will be described.

FIG. 28 is a block diagram illustrating a PLL circuit as a clock generation circuit proposed in Japanese Published Patent Application No. Hei. 5-90958. With reference to FIG. 28, reference numeral 301 denotes a horizontal sync signal input terminal, 302 denotes an analog-to-digital converter (ADC), 303 denotes a master clock (MCK) input terminal, 304 denotes a digital phase comparator, 305 denotes a frequency divider, 306 denotes a digital low-pass filter (LPF), 307 denotes a digital timing oscillator (DTO), 308 denotes a digital-to-analog converter (DAC), 309 denotes an analog phase comparator, 310 denotes a reference (REF) signal input terminal, 311 denotes an analog LPF, 312 denotes an analog VCO, and 313 denotes a clock output terminal.

This PLL circuit is provided with, in addition to a first loop which compares the phase of a horizontal sync signal inputted through the horizontal sync signal input terminal 301 with the phase of a signal based on an output signal of the DTO 307 by the digital phase comparator 304, and controls the DTO 307 with the output of the comparator 304, a second loop which compares the phase of the output signal of the DTO 307 with the phase of an REF signal inputted through the REF signal input terminal 310 by the analog phase comparator 309, and supplies an output of the analog VCO 309 to the clock of the DTO 307 according to the output of the comparator 309, whereby the PLL circuit is operated as a digital PLL as a whole to generate a clock synchronized with the horizontal sync signal that is inputted through the horizontal sync signal input terminal 301.

In the conventional construction, however, the output of the PLL circuit can be synchronized with only a single sync signal. Therefore, if the conventional clock generation circuit is used in a device to which a certain video signal is inputted from among plural kinds of video signals, like a television receiver in recent years, it is impossible to take a response such as generating a burst lock clock for a composite signal like a video signal while generating a line lock clock for a component signal.

Further, when receiving a personal computer signal input, it is necessary to shift the clock phase of the input ADC. However, in the construction of the conventional clock generation circuit, it is impossible to shift the clock phase of the input ADC when receiving such personal computer signal.

Furthermore, although a video signal and a sync signal are separated in the personal computer signal, the conventional clock generation circuit cannot respond to that the video signal and the sync signal are separated.

Moreover, in recent systems, in order to prevent interference due to a high frequency to be used, conscious spread of the frequency or the like is carried out. However, the conventional clock generation circuit cannot take a response such as consciously spreading the frequency.

Furthermore, during a signal processing in a liquid crystal television receiver or the like, it is necessary to generate both a burst clock and a line clock. However, the conventional clock generation circuit cannot generate both of these clocks, and therefore, it cannot be used in a liquid crystal television or the like.

SUMMARY OF THE INVENTION

The present invention is made to solve the above-mentioned problems and has for its object to provide a clock generation apparatus which can generate, even when a video signal among plural kinds of signals is inputted, a burst lock clock and a line lock clock suited to each input signal without increasing the number of PLLs.

It is another object of the present invention to provide a clock generation apparatus which can shift a clock phase of an input ADC when shifting of the clock phase of the input ADC is required as in a personal computer signal input, and can respond to that a video signal and a sync signal are separated like in the personal computer input.

It is still another object of the present invention to provide a clock generation apparatus which can deal with a case where it is necessary to consciously diffuse a high frequency to be used by a system to prevent interference from the frequency.

It is a further object of the present invention to provide a clock generation apparatus which can generate both of a burst lock clock and a line lock clock simultaneously when both of these sync clocks are required.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, there is provided a clock generation apparatus comprising: an analog-to-digital converter (hereinafter referred to as an ADC) for converting a video signal on which a burst signal or a sync signal is superimposed, which is inputted through a video input terminal, into a digital signal, and outputting the digital signal; a burst signal extraction circuit for receiving the video signal digitized by the ADC, and extracting the burst signal from the video signal; a first phase comparator for comparing the phase of the burst signal extracted by the burst signal extraction circuit with the phase of a clock that operates the ADC; a first digital low-pass filter (hereinafter referred to as a digital LPF) for receiving the output of the first phase comparator, and smoothing the output of the first phase comparator to output phase error information; a horizontal sync signal separation circuit for receiving the video signal digitized by the ADC, and separating the horizontal sync signal from the video signal; a second phase comparator for comparing the phase of the horizontal sync signal that is separated by the horizontal sync signal separation circuit with the phase of the clock that operates the ADC; a second digital LPF for receiving the output of the second phase comparator, and smoothing the output of the second phase comparator to output phase error information; a switch circuit for receiving the output of the digital LPF and the output of the second digital LPF, and selecting one of these outputs; a digital timing oscillator (hereinafter referred to as a DTO) for receiving phase error information that is either the output of the first digital LPF or the output of the second digital LPF, which is outputted from the switch circuit, and outputting a digital timing signal which is generated at a timing according to the phase error information; a digital-to-analog converter (hereinafter referred to as a DAC) for converting the digital timing signal outputted from the DTO into an analog signal, and outputting the analog signal; and a PLL for supplying the ADC with a PLL clock according to the analog signal output from the DAC. Therefore, it is possible to realize a clock generation apparatus which can deal with, using a PLL, clock generation in a signal processing for a video signal that requires burst lock, and clock generation in a signal processing for a component signal that requires line lock.

According to a second aspect of the present invention, there is provided a clock generation circuit comprising: an ADC for converting a video signal on which a sync signal is superimposed, which is inputted through a video input terminal, into a digital signal, and outputting the digital signal; a horizontal sync signal separation circuit for receiving the video signal digitized by the ADC, and separating the horizontal sync signal from the video signal; a phase comparator for comparing the phase of the horizontal sync signal that is separated by the horizontal sync signal separation circuit with the phase of a clock that operates the ADC; a digital LPF for receiving the output of the phase comparator, and smoothing the output of the phase comparator to output phase error information; a stationary phase error addition circuit for receiving the phase error information from the digital LPF, and adding stationary phase error to the phase error information; a DTO for receiving the phase error information outputted from the stationary phase error addition circuit, and outputting a digital timing signal that is generated at a timing according to the phase error information; a DAC for converting the digital timing signal outputted from the DTO into an analog signal, and outputting the analog signal; and a PLL for supplying the ADC with a PLL clock according to the analog signal output from the DAC. Therefore, it is possible to realize a clock generation apparatus which can shift the phase of a clock with respect to a horizontal sync signal, and provide a clearer image when sampling a personal computer signal or the like.

According to a third aspect of the present invention, there is provided a clock generation circuit comprising: a first ADC for converting a video signal on which a sync signal is superimposed or a sync signal, which is inputted through a first video signal input terminal, into a digital signal, and outputting the digital signal; a second ADC for converting a video signal inputted through a second video signal input terminal into a digital signal, and outputting the digital signal; a horizontal sync signal separation circuit for receiving the video signal or sync signal that is digitized by the first ADC, and separating the horizontal sync signal from the signal; a phase comparator for comparing the phase of the horizontal sync signal that is separated by the horizontal sync signal separation circuit with the phase of a clock that operates the first ADC; a digital LPF for receiving the output of the phase comparator, and smoothing the output of the phase comparator to output phase error information; a stationary phase error addition circuit for receiving the phase error information from the digital LPF, and adding stationary phase error to the phase error information; a DTO for receiving the phase error information outputted from the stationary phase error addition circuit, and outputting a digital timing signal that is generated at a timing according to the phase error information; a DAC for converting the digital timing signal outputted from the DTO into an analog signal, and outputting the analog signal; and a PLL for supplying the first ADC and the second ADC with a PLL clock according to the analog signal output from the DAC. Therefore, it is possible to realize a clock generation apparatus which can shift the phase of a clock with respect to a horizontal sync signal, and which can deal with a case where a sync signal and a video signal are separated as in a personal computer signal, by inputting the sync signal in the first ADC while inputting the video signal in the second ADC.

According to a fourth aspect of the present invention, there is provided a clock generation circuit comprising: an ADC for converting a video signal on which a sync signal is superimposed, which is inputted through a video input terminal, into a digital signal, and outputting the digital signal; a horizontal sync signal separation circuit for receiving the video signal digitized by the ADC, and separating the horizontal sync signal from the video signal; a phase comparator for comparing the phase of the horizontal sync signal that is separated by the horizontal sync signal separation circuit with the phase of a clock that operates the ADC; a stationary phase error addition circuit for adding stationary phase error to the phase error information outputted from the phase comparator; a digital LPF for smoothing the output of the stationary phase error addition circuit; a DTO for receiving the phase error information outputted from the digital LPF, and outputting a digital timing signal that is generated at a timing according to the phase error information; a DAC for converting the digital timing signal outputted from the DTO into an analog signal, and outputting the analog signal; and a PLL for supplying the ADC with a PLL clock according to the analog signal output from the DAC. Therefore, it is possible to realize a clock generation apparatus which can shift the phase of a clock with respect to a horizontal sync signal, and which can provide a clearer image when sampling a personal computer signal or the like.

According to a fifth aspect of the present invention, there is provided a clock generation circuit comprising: a first ADC for converting a video signal on which a sync signal is superimposed or a sync signal, which is inputted through a first video signal input terminal, into a digital signal, and outputting the digital signal; a second ADC for converting a video signal inputted through a second video signal input terminal into a digital signal, and outputting the digital signal; a horizontal sync signal separation circuit for receiving the video signal or sync signal that is digitized by the first ADC, and separating the horizontal sync signal from the signal; a phase comparator for comparing the phase of the horizontal sync signal that is separated by the horizontal sync signal separation circuit with the phase of a clock that operates the first ADC; a stationary phase error addition circuit for adding stationary phase error to the phase error information outputted from the phase comparator; a digital LPF for smoothing the output of the stationary phase error addition circuit; a DTO for receiving the phase error information outputted from the digital LPF, and outputting a digital timing signal that is generated at a timing according to the phase error information; a DAC for converting the digital timing signal outputted from the DTO into an analog signal, and outputting the analog signal; and a PLL for supplying the first ADC and the second ADC with a PLL clock according to the analog signal output from the DAC. Therefore, it is possible to realize a clock generation apparatus which can shift the phase of a clock with respect to a horizontal sync signal, and which can deal with a case where a sync signal and a video signal are separated as in a personal computer signal, by inputting the sync signal in the first ADC while inputting the video signal in the second ADC.

According to a sixth aspect of the present invention, there is provided a clock generation circuit comprising: a first ADC for converting a video signal on which a sync signal is superimposed or a sync signal, which is inputted through a first video signal input terminal, into a digital signal, and outputting the digital signal; a second ADC for converting a video signal inputted through a second video signal input terminal into a digital signal, and outputting the digital signal; a horizontal sync signal separation circuit for receiving the video signal or sync signal that is digitized by the first ADC, and separating the horizontal sync signal from the signal; a phase comparator for comparing the phase of the horizontal sync signal that is separated by the horizontal sync signal separation circuit with the phase of a clock that operates the first ADC; a digital LPF for receiving the output of the phase comparator, and smoothing the output of the phase comparator to output phase error information; a DTO for receiving the phase error information outputted from the digital LPF, and outputting a digital timing signal that is generated at a timing according to the phase error information; a DAC for converting the digital timing signal outputted from the DTO into an analog signal, and outputting the analog signal; a PLL for supplying the first ADC with a PLL clock according to the analog signal output from the DAC; a delayed lock loop (hereinafter referred to as a DLL) for receiving the clock outputted from the PLL, and delaying the clock to output multiple-phase clocks; and a clock selection circuit for selecting one of the multiple-phase clocks outputted from the DLL, and supplying the second ADC with the selected clock. Therefore, it is possible to realize a clock generation apparatus which can shift only the phase of a clock to be supplied to the second ADC, and which can shift only the phase of sampling of a video signal in a case where a sync signal and a video signal are separately inputted.

According to a seventh aspect of the present invention, in the clock generation apparatus according to the sixth aspect, the DLL comprises a clock input terminal, N stages of variable delay elements for delaying a clock inputted through the clock input terminal, a phase comparator for comparing the outputs of the variable delay elements with a clock inputted through the clock input terminal, an LPF for smoothing the output of the phase comparator, a bias circuit for receiving the output of the LPF and controlling the delay values of the variable delay elements, and an output terminal for outputting the outputs of the N stages of variable delay elements.

According to an eighth aspect of the present invention, there is provided a clock generation circuit comprising: a first ADC for converting a video signal on which a sync signal is superimposed or a sync signal, which is inputted through a first video signal input terminal, into a digital signal, and outputting the digital signal; a second ADC for converting a video signal inputted through a second video signal input terminal into a digital signal, and outputting the digital signal; a horizontal sync signal separation circuit for receiving the video signal or sync signal that is digitized by the first ADC, and separating the horizontal sync signal from the signal; a phase comparator for comparing the phase of the horizontal sync signal that is separated by the horizontal sync signal separation circuit with the phase of a clock that operates the first ADC; a digital LPF for receiving the output of the phase comparator, and smoothing the output of the phase comparator to output phase error information; a DTO for receiving the phase error information outputted from the digital LPF, and outputting a digital timing signal that is generated at a timing according to the phase error information; a DAC for converting the digital timing signal outputted from the DTO into an analog signal, and outputting the analog signal; a multiple phase output PLL for multiplying the output of the DAC to supply a clock to the first ADC, and simultaneously, outputting an intermediate phase among the multiple phases; and a clock selection circuit for selecting one of the multiple phase clocks outputted from the multiple phase output PLL, and supplying the second ADC with the selected clock. Therefore, it is possible to realize a clock generation apparatus which can shift only the phase of a clock to be supplied to the second ADC, and which can shift only the phase of sampling of a video signal in a case where a sync signal and a video signal are separately inputted.

According to a ninth aspect of the present invention, in the clock generation apparatus according to the eighth aspect, the multiple phase output PLL comprises a ring oscillator comprising M stages of variable delay elements, a frequency divider for converting the frequency of the output of the ring oscillator to 1/K, a phase comparator for comparing the phase of the output from the frequency divider with the phase of an REF signal inputted through an REF signal input terminal, an LPF for receiving the output of the phase comparator, a bias circuit for receiving the output of the LPF, and controlling the delay values of the variable delay elements, and an output terminal for outputting the outputs of the M stages of variable delay elements.

According to a tenth aspect of the present invention, there is provided a clock generation circuit comprising: an ADC for converting a video signal on which a sync signal is superimposed, which is inputted through a video input terminal, into a digital signal, and outputting the digital signal; a horizontal sync signal separation circuit for receiving the video signal digitized by the ADC, and separating the horizontal sync signal from the video signal; a phase comparator for comparing the phase of the horizontal sync signal that is separated by the horizontal sync signal separation circuit with the phase of a clock that operates the ADC; a digital LPF for receiving the output of the phase comparator, and smoothing the output of the phase comparator to output phase error information; a first DTO for receiving the phase error information outputted from the digital LPF, and outputting a digital timing signal that is generated at a timing according to the phase error information; a DAC for converting the digital timing signal outputted from the first DTO into an analog signal, and outputting the analog signal; a first PLL for supplying the first ADC with a PLL clock according to the analog signal output from the DAC; a frequency spread information generation circuit for generating frequency spread information; a second DTO for receiving the phase error information outputted from the digital LPF and the frequency spread information generated by the frequency spread information generation circuit, and outputting a digital timing signal; a second DAC for converting the digital timing signal outputted from the second DTO into an analog signal; and a PLL for outputting a PLL clock according to the analog signal output from the second DAC. Therefore, it is possible to realize a clock generation apparatus which can diffuse the frequency of a clock to reduce interference that occurs in the apparatus.

According to an eleventh aspect of the present invention, in the clock generation apparatus according to the tenth aspect, the frequency spread information generation circuit comprises a timing generation circuit which has a clock input terminal and counts the clocks inputted through the clock input terminal to generate a timing, and an up/down counter which receives a timing waveform generated by the timing generation circuit and switches between up counting and down counting.

According to a twelfth aspect of the present invention, there is provided a clock generation circuit comprising: an ADC for converting a video signal on which a sync signal is superimposed, which is inputted through a video input terminal, into a digital signal, and outputting the digital signal; a horizontal sync signal separation circuit for receiving the video signal digitized by the ADC, and separating the horizontal sync signal from the video signal; a phase comparator for comparing the phase of the horizontal sync signal that is separated by the horizontal sync signal separation circuit with the phase of a clock that operates the ADC; a digital LPF for receiving the output of the phase comparator, and smoothing the output of the phase comparator to output phase error information; a DTO for receiving the phase error information outputted from the digital LPF, and outputting a digital timing signal that is generated at a timing according to the phase error information; a DAC for converting the digital timing signal outputted from the DTO into an analog signal, and outputting the analog signal; and a first PLL for supplying the first ADC with a PLL clock according to the analog signal output from the DAC; a second PLL for receiving the output of the DAC; a frequency spread information generation circuit for generating frequency spread information; a PWM circuit for converting the output of the frequency spread information generation circuit into an analog value; an analog LPF for receiving the output of the PWM circuit; and a resistor for adding the output of the analog LPF to a control voltage of a VCO which is a component of the second PLL. Therefore, it is possible to realize a clock generation apparatus which can diffuse the frequency of a clock to reduce interference that occurs in the apparatus.

According to a thirteenth aspect of the present invention, in the clock generation apparatus according to the twelfth aspect, the frequency spread information generation circuit comprises a timing generation circuit which has a clock input terminal and counts the clocks inputted through the clock input terminal to generate a timing, and an up/down counter which receives a timing waveform generated by the timing generation circuit and switches between up counting and down counting.

According to a fourteenth aspect of the present invention, there is provided a clock generation apparatus comprising: an ADC for converting a video signal on which a burst signal or a sync signal is superimposed, which is inputted through a video input terminal, into a digital signal, and outputting the digital signal; a burst signal extraction circuit for receiving the video signal digitized by the ADC, and extracting the burst signal from the video signal; a first phase comparator for comparing the phase of the burst signal extracted by the burst signal extraction circuit with the phase of a clock that operates the ADC; a first digital LPF for receiving the output of the first phase comparator, and smoothing the output of the first phase comparator to output phase error information; a first DTO for receiving the phase error information outputted from the first digital LPF, and outputting a digital timing signal that is generated at a timing according to the phase error information; a first DAC for converting the digital timing signal outputted from the first DTO into an analog signal, and outputting the analog signal; a first PLL for supplying the ADC with a PLL clock according to the analog signal output from the first DAC; a horizontal sync signal separation circuit for receiving the video signal digitized by the ADC, and separating a horizontal sync signal from the video signal; a second phase comparator for comparing the phase of the horizontal sync signal separated by the horizontal sync signal separation circuit with the phase of the clock that operates the ADC; a second digital LPF for receiving the output of the second phase comparator, and smoothing the output of the second phase comparator to output phase error information; a frequency phase calculation circuit for receiving frequency information and phase information of the output of the first DTO and, the phase error information outputted from the second digital LPF, and outputting frequency information and phase information which are needed to generate a clock synchronized with the horizontal sync signal; a second DTO for receiving the output of the frequency phase calculation circuit, and outputting a digital timing signal which is generated at a timing according to the output of the frequency phase calculation circuit; a second DAC for converting the digital timing signal outputted from the second DTO into an analog signal, and outputting the analog signal; and a second PLL for outputting a PLL clock according to an analog signal output from the second DAC. Therefore, it is possible to realize a clock generation apparatus which can simultaneously generate a clock synchronized with a burst signal and a clock synchronized with a horizontal sync signal, which are required in a system such as a liquid crystal television or the like.

According to a fifteenth aspect of the present invention, in the clock generation apparatus according to the fourteenth aspect, the frequency phase calculation circuit comprises a line lock clock frequency information generation circuit for receiving phase error information between a burst lock clock and the horizontal sync signal, which is an output of the second digital LPF, and frequency information of a burst lock clock of the first DTO; and a line lock clock phase information generation circuit for receiving frequency information of a line lock clock outputted from the line lock clock frequency information generation circuit, phase information of the burst lock clock of the first DTO, the frequency information of the burst lock clock, and the phase error information between the burst lock clock and the horizontal sync signal. Therefore, frequency information and phase information which are required for line lock can be calculated with only digital data, whereby a stable system can be set up.

According to a sixteenth aspect of the present invention, in the clock generation apparatus according to the fifteenth aspect, the line lock clock frequency information generation circuit comprises a frequency ratio calculation circuit which receives the frequency division ratio of the burst lock clock to the horizontal sync signal during standard operation, the frequency division ratio of the line lock clock to the horizontal sync signal, and a phase difference between the actual horizontal sync signal and the signal obtained by frequency dividing the clock during burst lock clock standard operation, and calculates the ratio of frequencies between the burst lock clock and the line lock clock; and a multiplier which multiplies the frequency information of the burst lock clock by the ratio of the frequencies that is calculated by the frequency ratio calculation circuit to output frequency information of the line lock clock. Therefore, frequency information can be generated by ratio calculation and multiplication using a factor obtained by the ratio calculation, whereby the clock generation apparatus can easily be incorporated in a digital circuit.

According to a seventeenth aspect of the present invention, in the clock generation apparatus according to the fifteenth aspect, the line lock phase information generation circuit comprises a timing generation circuit for generating a timing for setting an initial value of the second DTO that generates the line lock clock, and a timing for capturing the phase information of the burst lock clock; a line lock/burst lock frequency ratio calculation circuit for calculating the ratio of frequencies from the burst lock frequency information and the line lock frequency information; and an initial value calculation circuit for calculating an initial value of the second DTO that generates the line lock clock from the phase difference between the actual horizontal sync signal and the signal obtained by frequency dividing the clock during burst lock clock standard operation, the phase information of the burst lock clock, and the frequency ratio obtained by the line lock/burst lock frequency ratio calculation circuit. Therefore, frequency information of the DTO and phase information of the DTO for burst lock and line lock can be obtained by four arithmetic operations, whereby the clock generation apparatus can be incorporated in a digital circuit.

According to an eighteenth aspect of the present invention, there is provided a clock generation apparatus comprising: an ADC for converting a video signal on which a burst signal or a sync signal is superimposed, which is inputted through a video input terminal, into a digital signal, and outputting the digital signal; a burst signal extraction circuit for receiving the video signal digitized by the ADC, and extracting the burst signal from the video signal; a first phase comparator for comparing the phase of the burst signal extracted by the burst signal extraction circuit with the phase of a clock that operates the ADC; a first digital LPF for receiving the output of the first phase comparator, and smoothing the output of the first phase comparator to output phase error information; a first DTO for receiving the phase error information outputted from the first digital LPF, and outputting a digital timing signal that is generated at a timing according to the phase error information; a first DAC for converting the digital timing signal outputted from the first DTO into an analog signal, and outputting the analog signal; a first PLL for supplying the ADC with a PLL clock according to the analog signal output from the first DAC; a horizontal sync signal separation circuit for receiving the video signal digitized by the ADC, and separating a horizontal sync signal from the video signal; a second phase comparator for comparing the phase of the horizontal sync signal separated by the horizontal sync signal separation circuit with the phase of the clock that operates the ADC; a second digital LPF for receiving the output of the second phase comparator, and smoothing the output of the second phase comparator to output phase error information; a frequency spread information generation circuit for generating frequency spread information; a frequency phase calculation circuit for receiving frequency information and phase information of the output of the first DTO, and the phase error information outputted from the second digital LPF, and outputting frequency information and phase information which are needed to generate a clock synchronized with the horizontal sync signal; a second DTO for receiving the output of the frequency phase calculation circuit and the output of the frequency spread information generation circuit, and outputting a digital timing signal; a second DAC for converting the digital timing signal outputted from the second DTO into an analog signal, and outputting the analog signal; and a second PLL for outputting a PLL clock according to an analog signal output from the second DAC. Therefore, it is possible to realize a clock generation apparatus which can generate a line lock clock as well as a burst lock clock, and which can diffuse the frequencies of the clocks to reduce interference that occurs in the apparatus.

According to a nineteenth aspect of the present invention, in the clock generation apparatus according to the eighteenth aspect, the frequency spread information generation circuit comprises a timing generation circuit which has a clock input terminal and counts the clocks inputted through the clock input terminal to generate a timing, and an up/down counter which receives a timing waveform generated by the timing generation circuit and switches between up counting and down counting.

According to a twelfth aspect of the present invention, there is provided a clock generation apparatus comprising: an ADC for converting a video signal on which a burst signal or a sync signal is superimposed, which is inputted through a video input terminal, into a digital signal, and outputting the digital signal; a burst signal extraction circuit for receiving the video signal digitized by the ADC, and extracting the burst signal from the video signal; a first phase comparator for comparing the phase of the burst signal extracted by the burst signal extraction circuit with the phase of a clock that operates the ADC; a first digital LPF for receiving the output of the first phase comparator, and smoothing the output of the first phase comparator to output phase error information; a first DTO for receiving the phase error information outputted from the first digital LPF, and outputting a digital timing signal that is generated at a timing according to the phase error information; a first DAC for converting the digital timing signal outputted from the first DTO into an analog signal, and outputting the analog signal; a first PLL for supplying the ADC with a PLL clock according to the analog signal output from the first DAC; a horizontal sync signal separation circuit for receiving the video signal digitized by the ADC, and separating a horizontal sync signal from the video signal; a second phase comparator for comparing the phase of the horizontal sync signal separated by the horizontal sync signal separation circuit with the phase of the clock that operates the ADC; a second digital LPF for receiving the output of the second phase comparator, and smoothing the output of the second phase comparator to output phase error information; a frequency phase calculation circuit for receiving frequency information and phase information of the output of the first DTO, and the phase error information outputted from the second digital LPF, and outputting frequency information and phase information which are needed to generate a clock synchronized with the horizontal sync signal; a second DTO for receiving the output of the frequency phase calculation circuit, and outputting a digital timing signal that is generated at a timing according to the output of the frequency phase calculation circuit; a second DAC for converting the digital timing signal outputted from the second DTO into an analog signal, and outputting the analog signal; a second PLL for receiving the output of the second DAC; a frequency spread information generation circuit for generating frequency spread information; a PWM circuit for converting the output of the frequency spread information generation circuit into an analog value; an analog LPF for receiving the output of the PWM circuit; and a resistor for adding the output of the analog LPF to a control voltage of the VCO which is a component of the second PLL. Therefore, it is possible to realize a clock generation apparatus which can generate a line lock clock as well as a burst lock clock, and which can diffuse the frequencies of the clocks to reduce interference that occurs in the apparatus.

According to a twenty-first aspect of the present invention, in the clock generation apparatus according to the twentieth aspect, the frequency spread information generation circuit comprises a timing generation circuit which has a clock input terminal and counts the clocks inputted through the clock input terminal to generate a timing, and an up/down counter

DETAILED DESCRIPTION OF THE PREFERRED EMBODIMENTS

Hereinafter, clock generation apparatuses according to preferred embodiments of the present invention will be described with reference to the drawings.

Embodiment 1

Figure 1:
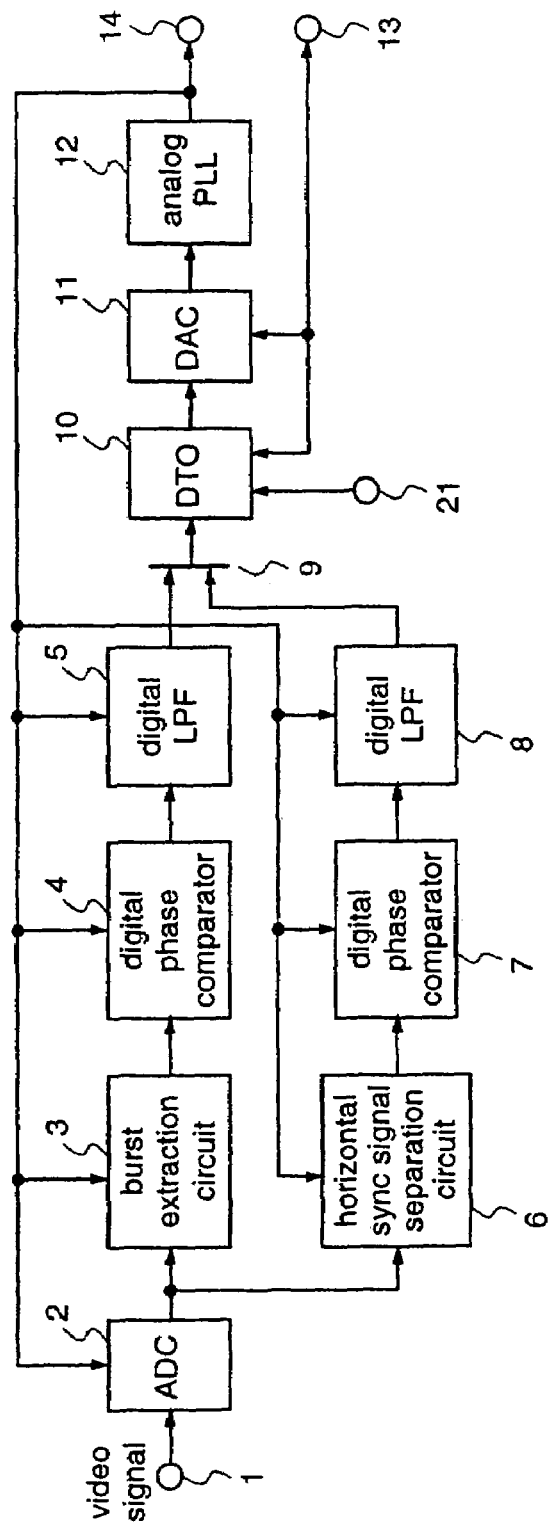
FIG. 1 is a block diagram illustrating the construction of a clock generation apparatus according to a first embodiment of the present invention.

FIG. 1 is a block diagram illustrating the construction of a clock generation circuit according to a first embodiment of the present invention.

In FIG. 1, reference numeral 1 denotes a video signal input terminal, 2 denotes an analog-to-digital converter (ADC), 3 denotes a burst extraction circuit, 4 denotes a digital phase comparator, 5 denotes a digital LPF, 6 denotes a horizontal sync signal separation circuit, 7 denotes a digital phase comparator, 8 denotes a digital LPF, 9 denotes a switch, 10 denotes a digital timing oscillator (DTO), 11 denotes a digital-to-analog converter (DAC), 12 denotes an analog PLL, 13 denotes a master clock (MCK) input terminal, 14 denotes a clock output terminal, and 21 denotes a center frequency information input terminal.

Figure 2:
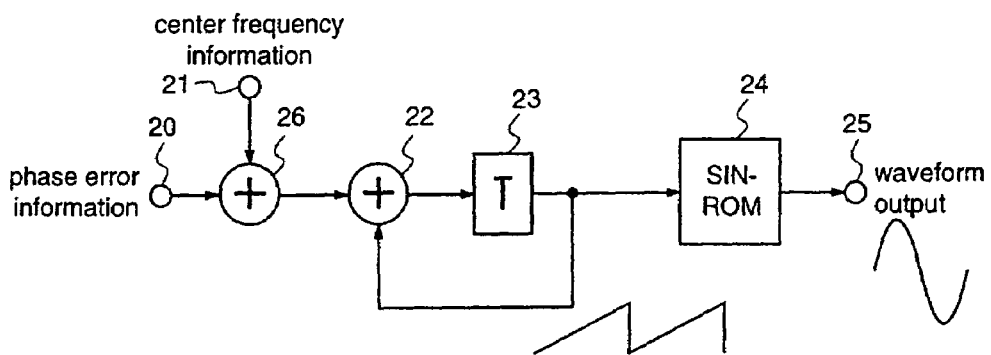
FIG. 2 is a block diagram illustrating the construction of a DTO 10 shown in FIG. 1.
Figure 3:
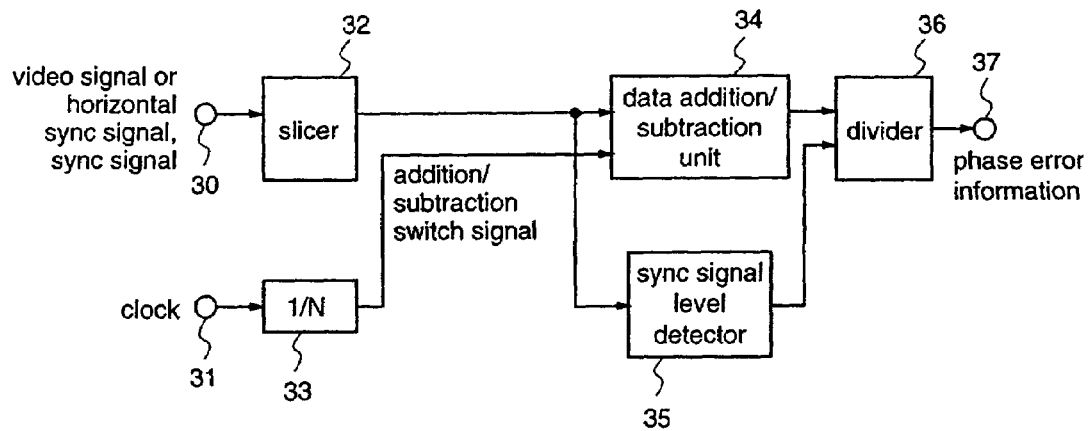
FIG. 3 is a block diagram illustrating the constructions of a horizontal sync signal separation circuit 6 and a digital phase comparator 7 shown in FIG. 1.
Figure 4:
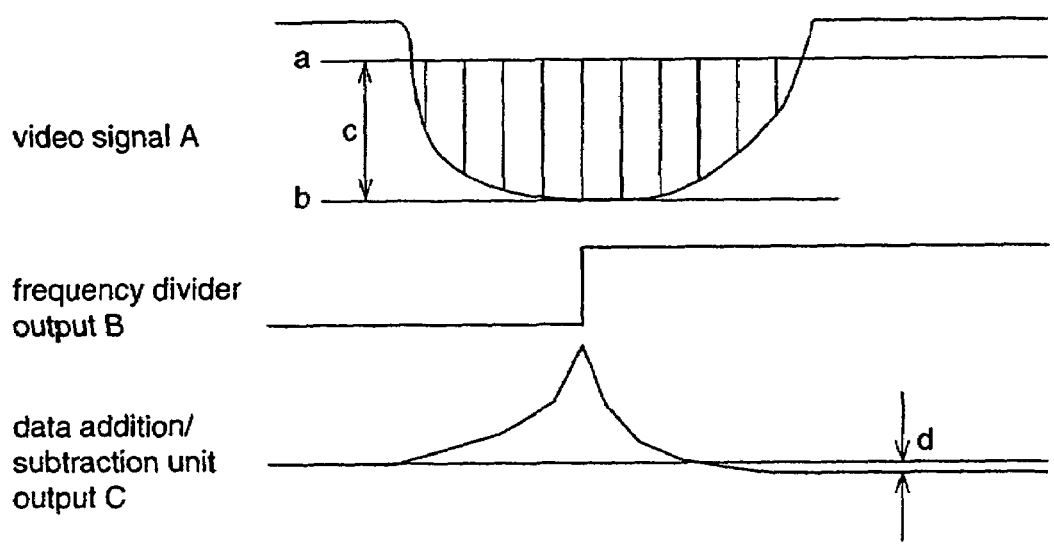
FIG. 4 is a timing chart for explaining the operations of the horizontal sync signal separation circuit 6 and the digital phase comparator 7 shown in FIG. 1.

FIG. 2 is a block diagram illustrating the construction of the DTO 10 shown in FIG. 1, FIG. 3 is a block diagram illustrating the constructions of the horizontal sync signal separation circuit 6 and the digital phase comparator 7 shown in FIG. 1, and FIG. 4 is a waveform diagram of the horizontal sync signal separation circuit shown in FIG. 3. In FIG. 2, reference numeral 20 denotes a phase error information input terminal, 21 denotes a center frequency information input terminal, 22 and 26 denote adders, 23 denotes a flip-flop, 24 denotes a SIN-ROM, and 25 denotes a waveform output terminal. In FIG. 3, reference numeral 30 denotes an input terminal for a video signal, or a horizontal sync signal, or a sync signal, 31 denotes a clock input terminal, 32 denotes a slicer, 33 denotes a frequency division circuit, 34 denotes a data addition/subtraction unit, 35 denotes a sync signal level detector, 36 denotes a divider, and 37 denotes a phase error information input terminal.

Hereinafter, the operation of the clock generation circuit according to the first embodiment will be described with reference to the drawings.

A composite signal represented by a video signal or a component signal as a signal from a DVD is inputted through the video signal input terminal 1. The input video signal is analog-to-digital converted by the ADC 2. The signal digitized by the ADC 2 should be subjected to video signal processing with a burst lock clock if the input signal is a composite signal. When the input signal is a component signal, it should be subjected to video signal processing with a line lock clock. In this first embodiment, when the input signal is a composite signal, a burst signal superimposed on the composite signal is extracted by the burst signal extraction circuit 3, and the phase of the extracted burst signal is compared with the phase of the clock by the digital phase comparator 4, and then the result is smoothed by the digital LPF 5, thereby outputting phase error information between the burst signal and the clock. The switch 9 is controlled by, for example, a control signal according to switching of the video signal inputted to the video signal input terminal 1. When the input signal is a composite signal, the switch 9 is controlled so as to pass the output of the digital LPF 5 between the output of the digital LPF 5 and the output of the digital LPF 8. Thereby, the output of the digital LPF 5 is input to the DTO 10, and a sinusoidal wave according to the phase error information is outputted from the DTO 10 and the DAC 11, and then the sinusoidal wave is multiplied by the analog PLL 12, whereby a clock required in the system is outputted from the clock output terminal 14. Simultaneously, the clock is fed back to the ADC 2 as a sampling clock, whereby a clock synchronized with the burst signal superimposed on the composite signal can be generated. The clock to be inputted to the MCK clock input terminal 13 should be a stable clock having a frequency higher than that of the burst signal.

On the other hand, in the video signal processing for the input signal which is a component signal, it is necessary to generate a line lock clock synchronized with the horizontal sync signal. In this case, the input signal is digitized by the ADC 2, and thereafter, only the horizontal sync signal is separated by the horizontal sync signal separation circuit 6. Then, the phase of the horizontal sync signal is compared with the phase of the clock by the digital phase comparator 7, and smoothed by the digital LPF 8, thereby outputting phase error information between the horizontal sync signal and the clock. When the input signal is a component signal, the switch 9 is controlled so as to pass the output of the digital LPF 8, between the output of the digital LPF 5 and the output of the digital LPF 8. Thereby, the output of the digital LPF 8 is input to the DTO 10, and the DTO 10 and the DAC 11 output a sinusoidal wave according to the phase error information, and the sinusoidal wave is multiplied by the analog PLL 12, whereby a clock required in the system is outputted from the clock output terminal 14. Simultaneously, the clock is fed back to the ADC 2 as a sampling clock, thereby generating a clock synchronized with the horizontal sync signal.

The DTO 10 will be described with reference to FIG. 2. The DTO 10 receives either the phase error information generated in the LPF 5 or the phase error information generated in the LPF 8, which is selected by the switch 9, through the phase error information input terminal 20, and further, it receives center frequency information of a frequency to be generated essentially, through the center frequency information input terminal 21. Since the center frequency information depends on the frequency that is needed in the system, it may be a fixed value. These two pieces of information are added by the adder 26, and thereafter, accumulated by the adder 22 and the flip-flop 23, thereby outputting a sawtooth wave of a desired frequency as an output of the flip-flop 23. The output of the flip-flop 23 is input to the SIN-ROM 24 wherein sinusoidal waveform information is written, and decoded to be output as a sinusoidal wave from the sinusoidal wave output terminal 25, whereby the DTO oscillates the sinusoidal wave.

Hereinafter, the operations of the horizontal sync signal separation circuit 6 and the digital phase comparator 7 will be described with reference to FIGS. 3 and 4. A digitized video signal and a sync signal are input through the signal input terminal 30. A video signal A shown in FIG. 4 is an enlarged portion of the horizontal sync signal that is superimposed on the video signal or the sync signal. These signals inputted through the signal input terminal 30 are sliced at an appropriate level (level a in FIG. 4) by the slicer 32, and the horizontal sync signal is extracted. The phase of the extracted signal is compared with the phase of a clock that is obtained by 1/N frequency dividing the clock (the clock outputted from the analog PLL 12) inputted through the clock input terminal 31 by the frequency divider 33. A frequency-divided output B shown in FIG. 4 is an enlarged view of a phase comparison part of the frequency-divided output B. The processing of phase comparison is as follows. When the frequency-divided output B is a logic value "0" in the data addition/subtraction unit 34, the amplitude of the sync signal is added. In FIG. 4, c which is a difference between the slice level a and the sync signal level b is added. When the frequency-divided output B is a logic value "1", the amplitude of the sync signal is subtracted. In FIG. 4, c which is a difference between the slice level a and the sync signal level b is subtracted. As a result, a data addition/subtraction unit output C is obtained, and a resultant d is a phase difference. In this circuit, a maximum value of c that is a difference of the level b of the sync signal is detected by the sync signal level detector 35 so that the weight of the phase error information is not changed depending on the level of the signal amplitude, and the d that is the final output of the data addition/subtraction unit is divided by this value to obtain phase error information from the phase error information output terminal 37.

As described above, the first embodiment of the present invention is provided with the first phase comparator 4 for comparing the phase of the burst signal extracted from the video signal that is digitized by the ADC 2 with the phase of the clock for operating the ADC 2; the first digital LPF 5 for smoothing the output of the first phase comparator 4 to output phase error information; the second phase comparator 7 for comparing the phase of the horizontal sync signal that is separated from the video signal digitized by the ADC 2 with the phase of the clock for operating the ADC 2; the second digital LPF 8 for smoothing the output of the second phase comparator 7 to output phase error information; and the switching circuit 9 which receives the output of the first digital LPF 5 and the output of the second digital LPF 8, thereby realizing a clock generation apparatus which can deal with, using a single PLL, clock generation during signal processing for a video signal that requires burst lock, and clock generation during signal processing for a component signal that requires line lock. Although particularly a DAC or an analog PLL is a circuit that occupies a large area in a miniaturized semiconductor device or the like, in this first embodiment the DAC and the analog PLL can share a common circuit, resulting in a reduction in the scale of the semiconductor device.

Embodiment 2

Figure 5:
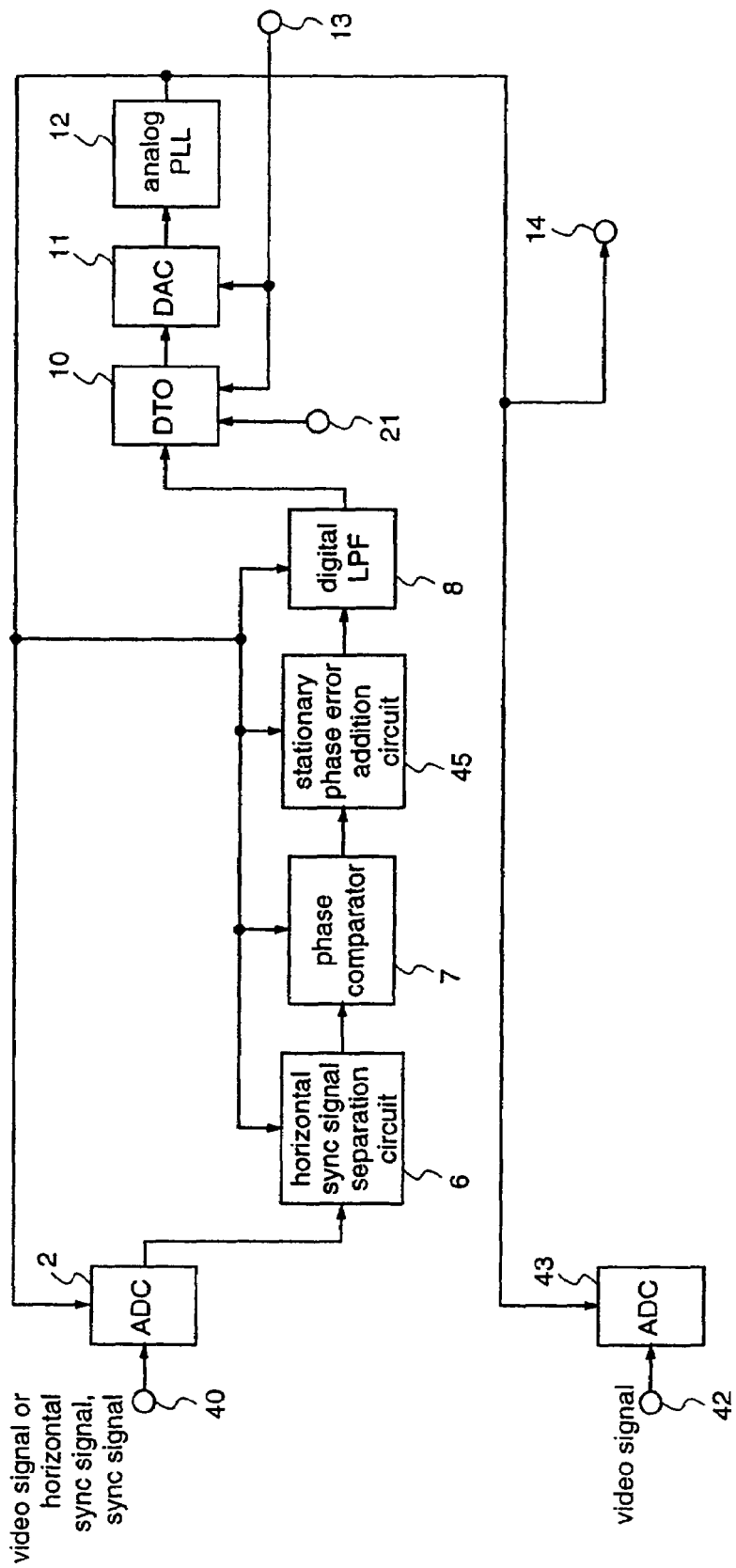
FIG. 5 is a block diagram illustrating the construction of a clock generation apparatus according to a second embodiment of the present invention.
Figure 6:
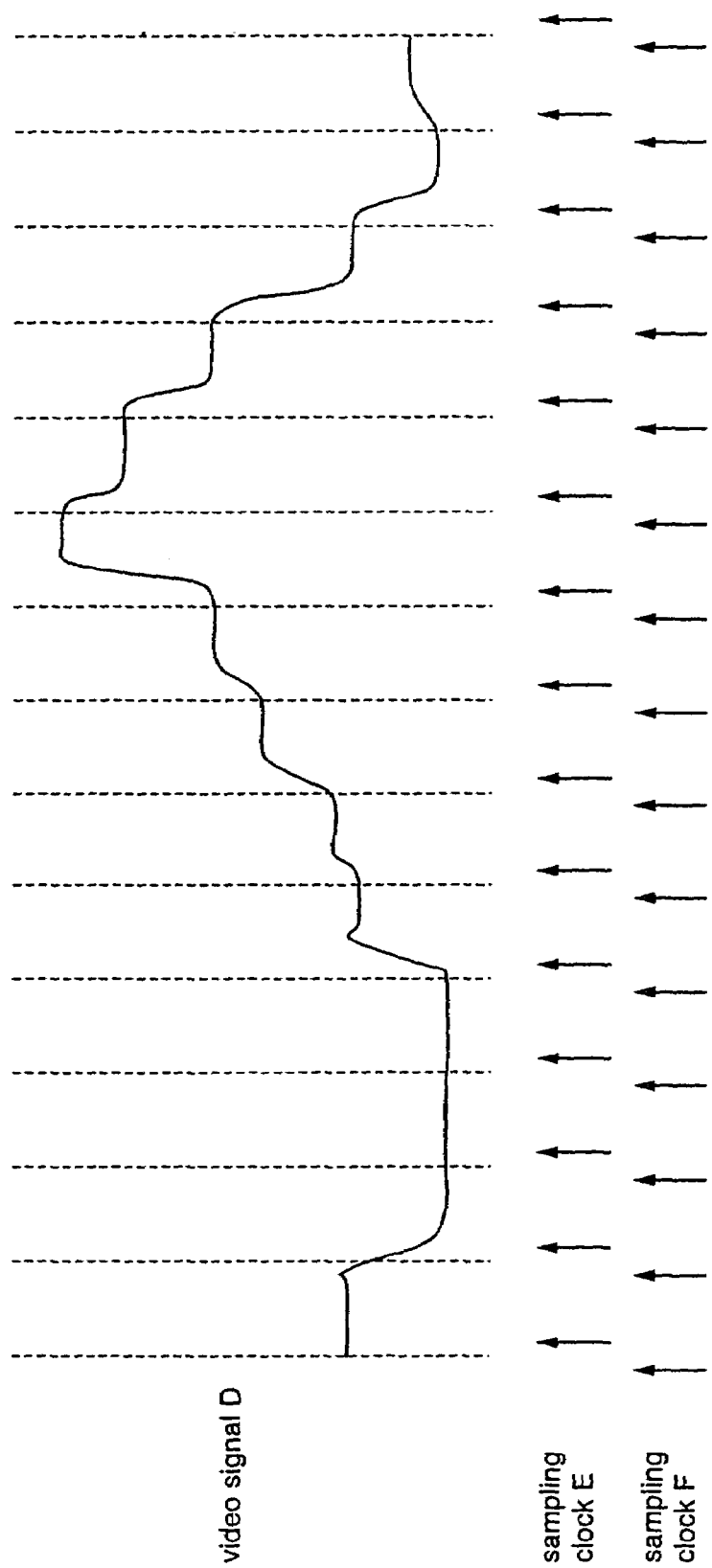
FIG. 6 is a timing chart for explaining a video signal sampling operation.

FIG. 5 is a block diagram illustrating the construction of a clock generation apparatus according to a second embodiment of the present invention. In FIG. 5, reference numeral 40 denotes a signal input terminal, 2 denotes an ADC, 6 denotes a horizontal sync signal separation circuit, 7 denotes a phase comparator, 45 denotes a stationary phase error addition circuit, 8 denotes a digital LPF, 10 denotes a DTO, 11 denotes a DAC, 12 denotes an analog PLL, 13 denotes a MCK input terminal, 14 denotes a clock output terminal, 42 denotes a video signal input terminal, and 43 denotes an ADC. Further, FIG. 6 is a diagram illustrating waveforms of video sampling clocks for the ADC 2 and the ADC 43.

Hereinafter, the operation of the clock generation apparatus according to the second embodiment will be described with reference to the drawings. A video signal on which a horizontal sync signal is superimposed is input through the signal input terminal 40. The input video signal is processed in like manner as described for the first embodiment by the ADC 2, the horizontal sync signal separation circuit 6, and the phase comparator 7, and a difference in phases between the horizontal sync signal and the clock is outputted as phase error information. Then, stationary phase error information is added to the phase error information by the stationary phase error addition circuit 45, the phase error information is smoothed by the digital LPF 8, a clock is generated using the DTO 10, the DAC 11, and the analog PLL 12, and the clock is fed back to the ADC 2 as a sampling clock, thereby generating a clock synchronized with the horizontal sync signal while holding the stationary phase error. Since the clock generation apparatus according to the second embodiment is provided with the stationary phase error addition circuit 45, the ADC can be sampled with a clock whose phase is shifted while synchronizing the clock with the horizontal sync signal. During sampling of a video signal that is outputted from the DAC while being synchronized with the clock, like a video signal from a personal computer, when the video signal from the DAC has a waveform as shown by a video signal D in FIG. 6, if the timing of the clock that performs sampling is the timing of a sampling clock E, the data in the middle of change are undesirably captured, and thereby a clear image cannot be obtained. However, a clear image can be obtained by shifting the phase, and performing sampling at the timing of a sampling clock F. Further, it is possible to cope with a personal computer signal in which a video signal and a horizontal sync signal are separated, by providing the ADC 43, inputting the sync signal through a signal input terminal 40 and the video signal through a video signal input terminal 42, and sampling the video signal with the second ADC 43.

Figure 7:
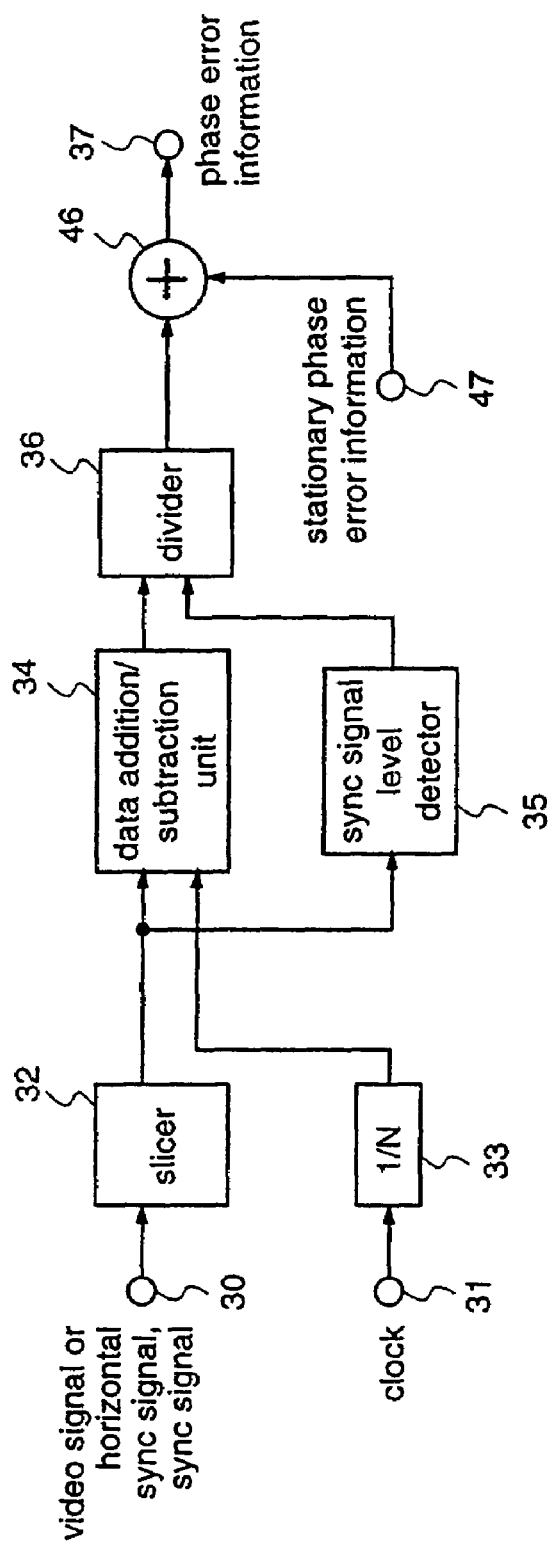
FIG. 7 is a diagram illustrating examples of a horizontal sync signal separation circuit 6, a phase comparator 7, and a stationary phase error addition circuit 45 shown in FIG. 5.

FIG. 7 is a block diagram illustrating the constructions of the horizontal sync signal separation circuit 6, the phase comparator 7, and the stationary phase error addition circuit 45.

In FIG. 7, reference numeral 30 denotes a signal input terminal, 31 denotes a clock input terminal, 32 denotes a slicer, 33 denotes a frequency divider, 34 denotes a data addition/subtraction unit, 35 denotes a sync signal level detector, 36 denotes a divider, and 37 denotes a phase error information output terminal. These constituents are identical to those of the horizontal sync signal separation circuit 6 and the phase comparator 7 of the clock generation apparatus according to the first embodiment. Further, 46 denotes an adder, and 47 denotes a stationary phase error information input terminal. The operations of the signal input terminal 30, the clock input terminal 31, the slicer 32, the divider 33, the data addition/subtraction unit 34, the sync signal level detector 35, and the divider 36 are identical to the operations of the corresponding parts of the clock generation apparatus according to the first embodiment. Stationary phase error information is inputted through the stationary phase error information input terminal 47, and phase error information outputted from the divider 36 is added to the stationary phase error information by the adder 46, thereby outputting the phase error information including the stationary phase error from the phase error information output terminal 37. Further, since the phase error information including the stationary phase error can be generated by adding the arbitrary stationary phase error information by the adder 46, the clock generation apparatus can be easily implemented by a digital circuit and incorporated in an LSI or the like.

As described above, since the clock generation apparatus according to the second embodiment is provided with the stationary phase error addition circuit 45 for adding the stationary phase error to the phase error information, the phase of the clock can be shifted with respect to the horizontal sync signal, thereby realizing a clock generation apparatus which can provide a clearer image when sampling a personal computer signal or the like.

Figure 8:
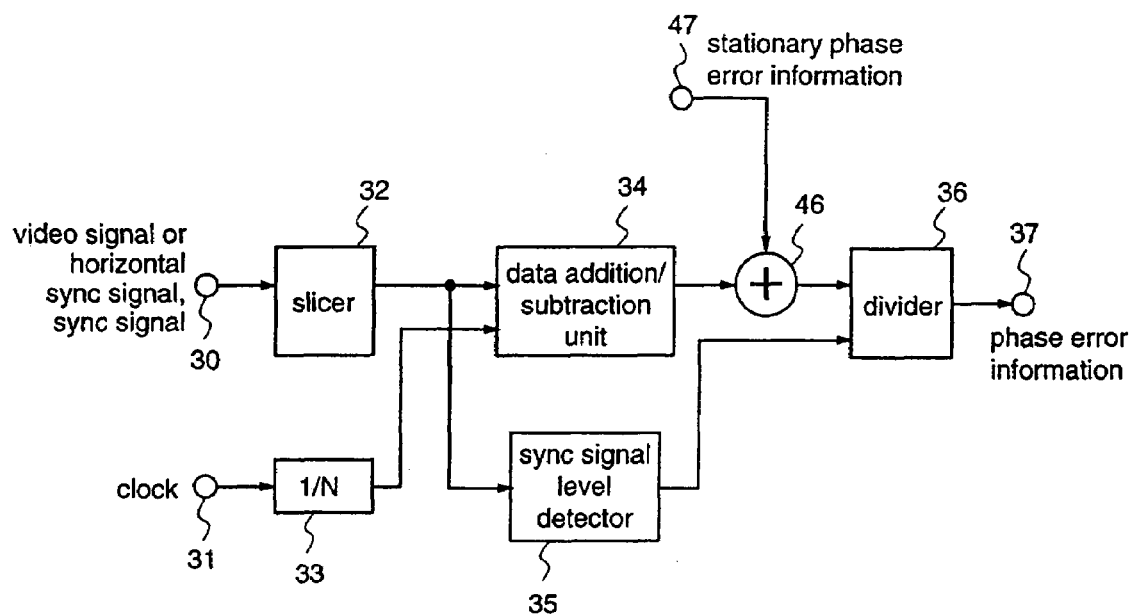
FIG. 8 is a diagram illustrating other examples of a horizontal sync signal separation circuit 6, a phase comparator 7, and a stationary phase error addition circuit 45 shown in FIG. 5.

While in FIG. 7 the adder 46 for adding the stationary phase error is provided in the stage after the divider 36, it may be provided in the stage before the divider 36 as shown in FIG. 8 with the same effects as mentioned above.

Embodiment 3

Figure 9:
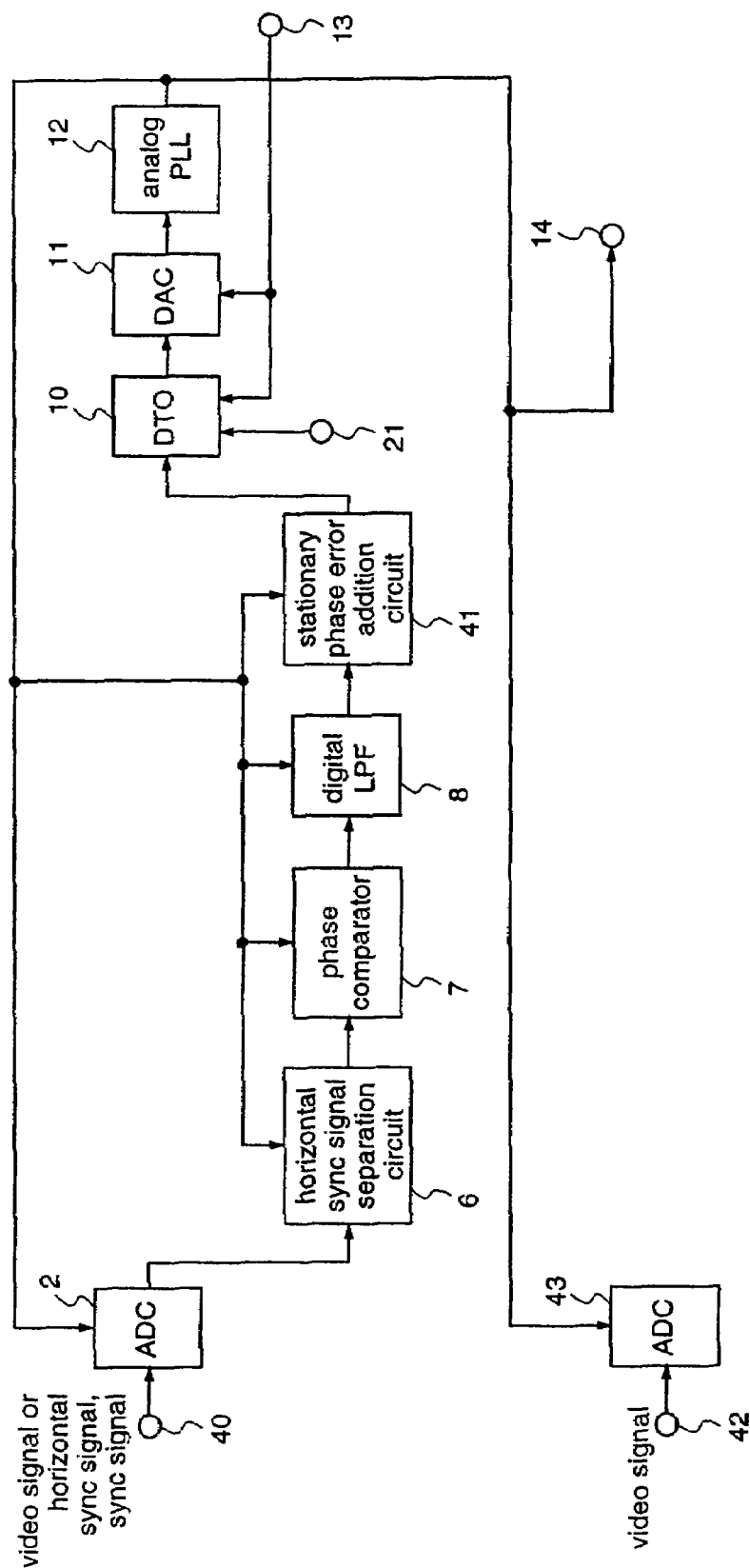
FIG. 9 is a block diagram illustrating the construction of a clock generation apparatus according to a third embodiment of the present invention.

FIG. 9 is a block diagram illustrating the construction of a clock generation apparatus according to a third embodiment of the present invention. In FIG. 9, the same reference numerals as those shown in FIG. 5 denote the same or corresponding parts, and reference numeral 41 denotes a stationary phase error addition circuit.

Hereinafter, the operation of the clock generation apparatus according to the third embodiment will be described. A video signal on which a horizontal sync signal is superimposed is inputted through the signal input terminal 40. The inputted video signal is processed in the same way as described for the first embodiment by the ADC 2, the horizontal sync signal separation circuit 6, and the phase comparator 7, whereby a phase difference between the horizontal sync signal and the clock is outputted as phase error information. This phase error information is smoothed by the digital LPF 8, and thereafter, stationary phase error information is added to the phase error information by the stationary phase error addition circuit 41. Then, a clock is generated using the DTO 10, the DAC 11, and the analog PLL 12, and this clock is fed back to the ADC 2 as a sampling clock, thereby generating a clock synchronized with the horizontal sync signal while holding the stationary phase error.

In contrast to the clock generation apparatus according to the second embodiment wherein the stationary phase error addition circuit is provided in the stage before the digital LPF 8, the clock generation apparatus according to the third embodiment has the stationary phase error addition circuit 41 in the stage after the digital LPF 8. Also in this construction, the same effects as described for the second embodiment can be achieved.

Embodiment 4

Figure 10:
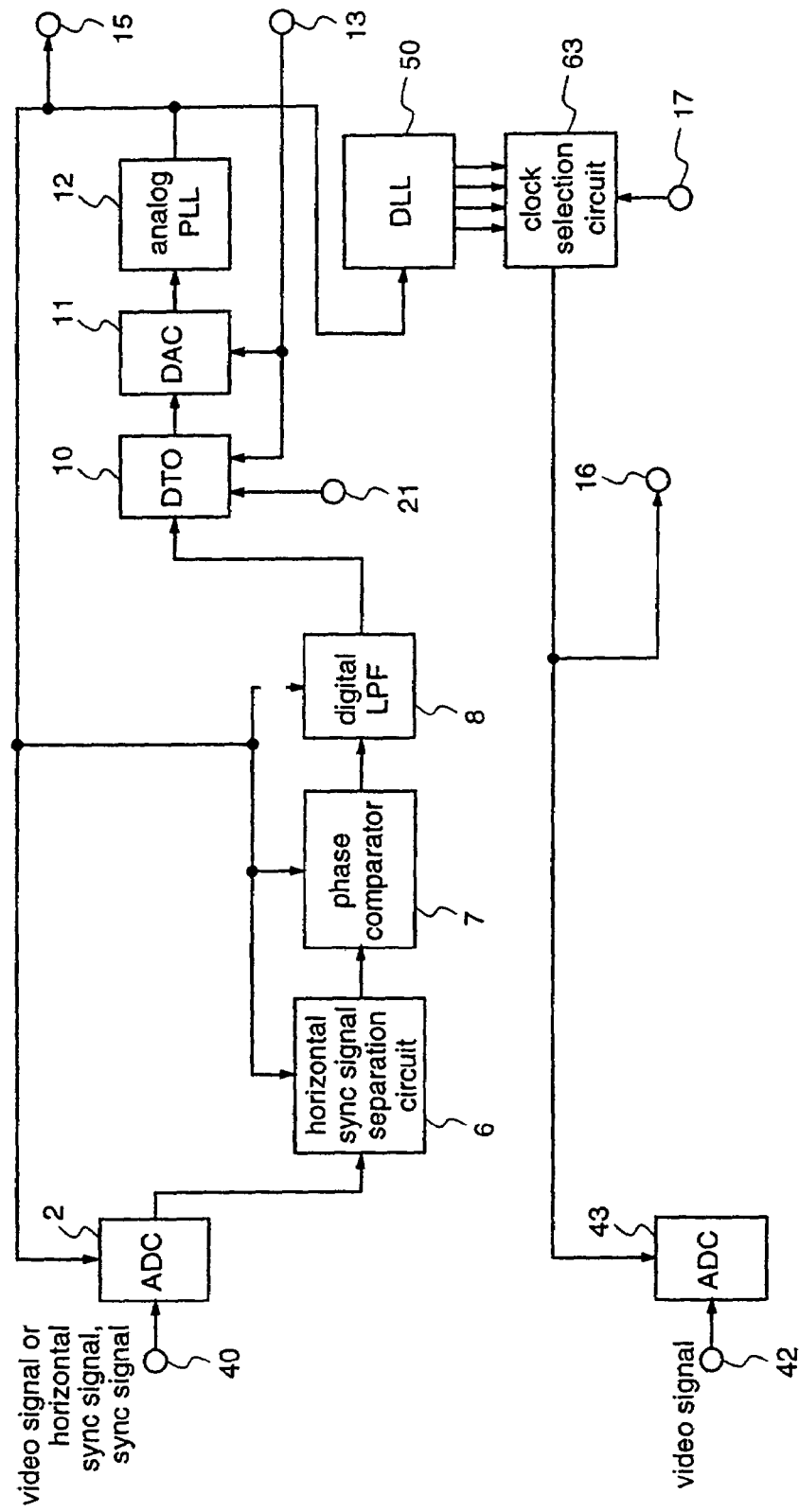
FIG. 10 is a block diagram illustrating the construction of a clock generation apparatus according to a fourth embodiment of the present invention.

FIG. 10 is a block diagram illustrating the construction of a clock generation apparatus according to a fourth embodiment of the present invention. In FIG. 10, the same reference numerals as those shown in FIG. 5 denote the same or corresponding parts, and reference numeral 50 denotes a delayed lock loop (DLL), 15 and 16 denote clock output terminals, and 17 denotes a control input terminal.

Figure 11:
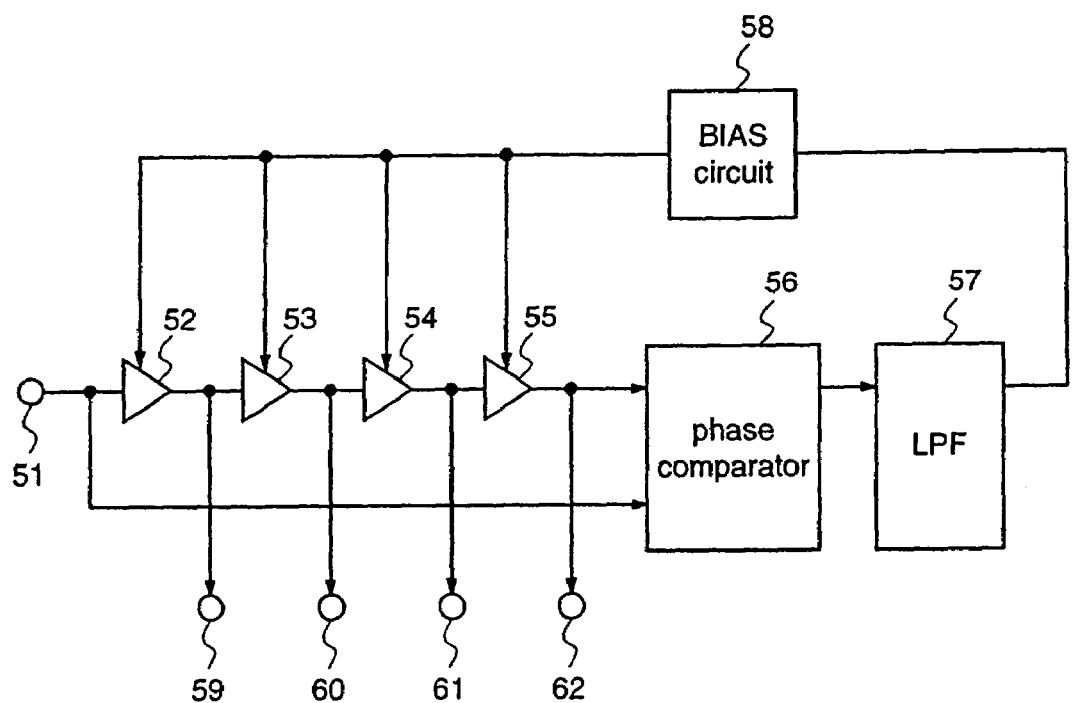
FIG. 11 is a block diagram illustrating the construction of a DLL 50 shown in FIG. 10.
Figure 12:
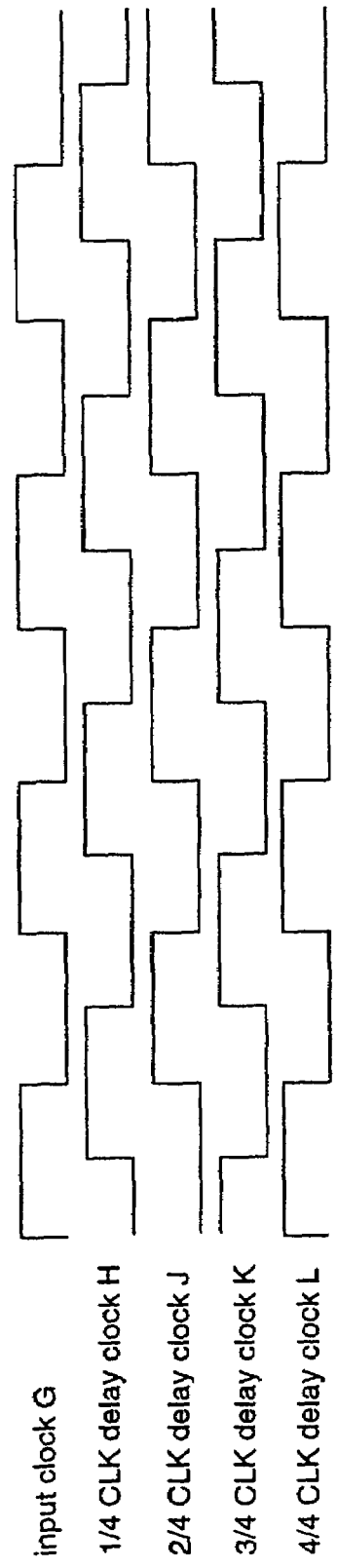
FIG. 12 is a timing waveform diagram for explaining the operation of the DLL 50 shown in FIG. 10.

Hereinafter, the operation of the clock generation apparatus according to the fourth embodiment will be described with reference to the drawings. The operation of the circuit comprising the ADC 2, the horizontal sync signal separation circuit 6, the phase comparator 7, the digital LPF 8, the DTO 10, the DAC 11, the analog PLL 12, the MCK input terminal 13, the signal input terminal 40, the video signal input terminal 42, and the ADC 43 is identical to the operation of the corresponding part of the clock generation apparatus according to the second embodiment. A clock synchronized with the horizontal sync signal can be generated by outputting a clock generated in the analog PLL 12 from the clock output terminal 15 and, simultaneously, feeding back the clock to the ADC 2 as a sampling clock. Further, in the clock generation apparatus according to the fourth embodiment, multiple-phase clocks are generated by the DLL 50 from the clock generated in the analog PLL 12. FIG. 11 is a block diagram illustrating an example of construction of the DLL 50 in the clock generation apparatus according the fourth embodiment. In FIG. 11, reference numeral 51 denotes a clock input terminal, 52 to 55 denote delay elements, 56 denotes a phase comparator, 57 denotes an LPF, and 58 denotes a BIAS circuit. In FIG. 11, there are four stages of delay elements. FIG. 12 is a diagram illustrating waveforms of outputs from the DLL 50. When a clock generated in the analog PLL 12 is inputted through the clock input terminal 51, the inputted clock is delayed by the delay elements 52 to 55, and then, in the phase comparator 56, the phase of the delayed clock is compared with the phase of a clock that is one clock behind the clock inputted through the clock input terminal 51. The result of phase comparison is smoothed by the LPF 58. The smoothed value is inputted to the BAIS circuit, wherein a voltage that varies the delay values of the delay elements 52 to 55 is generated. By varying the delay values of the delay elements 52 to 55, clocks that are delayed by ¼ from each other can be generated to be outputted from the multiple-phase clock output terminals 59 to 62. Then, the clock selection circuit 63 which operates on the basis of the control input supplied from the control input terminal 17 selects one of the multiple-phase clocks which are generated by the DLL 50, and the phase of the clock is shifted with respect to the clock generated in the analog PLL 12 to be outputted from the clock output terminal 16, and simultaneously, this clock is used as a sampling clock for the ADC 43.

As described above, the clock generation apparatus according to the fourth embodiment is provided with the DLL 50 to generate the multiple-phase clocks, and one of the clocks is selected by the clock selection circuit 63 to shift the phase of the clock. Therefore, like the second embodiment, when sampling a personal computer signal or the like, a clearer image can be obtained, and further, only the phase of the sampling clock of the ADC 43, i.e., the clock that samples the video signal, can be shifted, whereby disordering at phase change can be suppressed.

Embodiment 5

Figure 13:
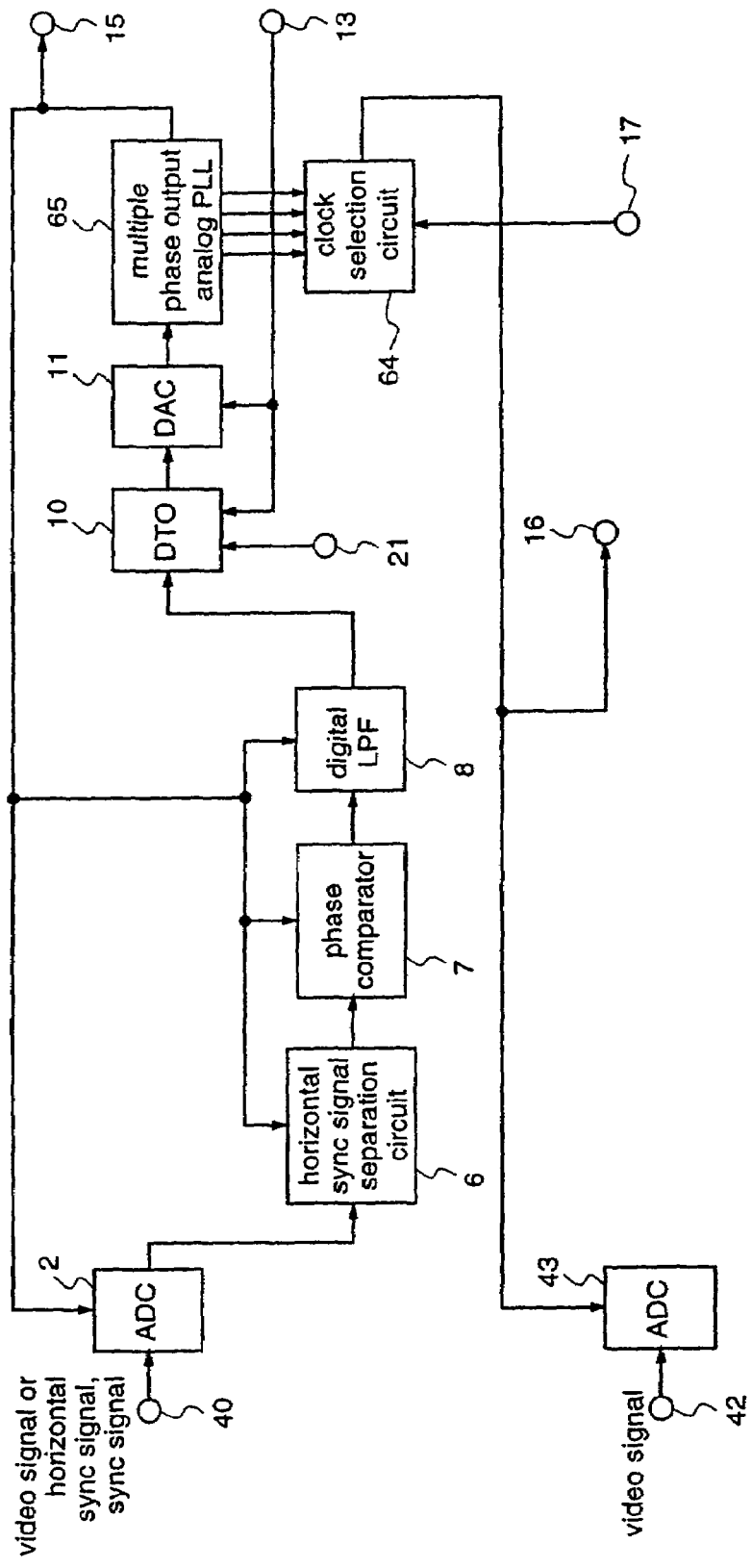
FIG. 13 is a block diagram illustrating the construction of a clock generation apparatus according to a fifth embodiment of the present invention.

FIG. 13 is a block diagram illustrating the construction of a clock generation apparatus according to a fifth embodiment of the present invention. In FIG. 13, the same reference numerals as those shown in FIG. 10 denote the same or corresponding parts, and reference numeral 64 denotes a clock selection circuit, and 65 denotes a multiple-phase output analog PLL.

Hereinafter, the operation of the clock generation apparatus according to the fifth embodiment will be described with reference to the drawings. The operation of the circuit comprising the ADC 2, the horizontal sync signal separation circuit 6, the phase comparator 7, the digital LPF 8, the DTO 10, the DAC 11, the MCK input terminal 13, the signal input terminal 40, the video signal input terminal 42, and the ADC 43 is identical to the operation of the corresponding part of the clock generation apparatus according to the second embodiment. The clock generation apparatus according to the fifth embodiment employs the multiple-phase output analog PLL 65 as an analog PLL for multiplying a sinusoidal wave generated by the DTO 10 and DAC 11, and outputs, as a multiple-phase clock, a clock having an intermediate phase of a clock that can be generated in the PLL.

Figure 14:
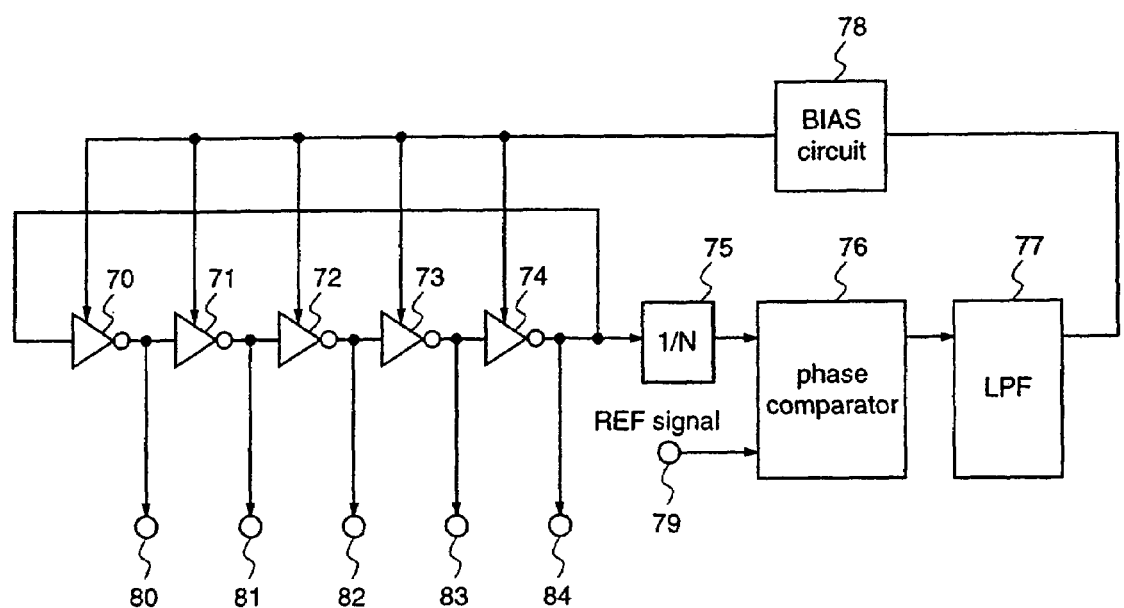
FIG. 14 is a block diagram illustrating the construction of a multiple-phase output analog PLL 65 shown in FIG. 13.

FIG. 14 is a block diagram illustrating the construction of the multiple-phase output analog PLL 65 in the clock generation apparatus according to the fifth embodiment. In FIG. 14, reference numerals 70 to 74 denote inversion delay elements, 75 denotes a frequency division circuit, 76 denotes a phase comparator, 77 denotes an LPF, 78 denotes a bias circuit, 79 denotes an REF signal input terminal, and 80 to 84 denote multiple-phase clock output terminals. In the multiple-phase output analog PLL 65, a clock is generated with a ring oscillator using the inversion delay elements 70 to 74, the generated clock is frequency-divided by the frequency division circuit 75, the phase of the clock is compared with the phase of the REF signal that is inputted through the REF signal input terminal by the phase comparator 76, and the result of phase comparison is smoothed by the LPF 77. The smoothed signal is converted into a voltage that controls the delay values of the inversion delay elements 70 to 74 in the BAIS circuit 78. It is possible to generate a clock that is phase-synchronized with the REF signal (the output signal of the DAC 11) and is multiplied, by controlling the delay values of the inversion delay elements 70 to 74 with the control voltage, a clock, and this clock signal is outputted from the clock output terminal 15, and simultaneously, is fed back to the ADC 2 as a sampling clock, thereby generating a clock synchronized with the horizontal sync signal. At this time, the outputs of the inversion delay elements 70 to 74 are outputted to the multiple-phase clock output terminals 80 to 84, respectively, whereby a clock of an intermediate phase of the multiple phases can be outputted. Then, the clock selection circuit 64 that is operated on the basis of the control input supplied from the control input terminal 17 selects any of the multiple-phase clocks generated by the multiple-phase output analog PLL 65, and the phase of the clock is shifted with respect to the clock synchronized with the horizontal sync signal, and then the clock is outputted from the clock output terminal 16. This clock is also used as a sampling clock of the ADC 43.

As described above, in the clock generation apparatus according to the fifth embodiment, a multiple-phase clocks are generated by using the multiple-phase output analog PLL 65, and any of the clocks is selected by the clock selection circuit 64 to shift the phase of the clock. Therefore, as in the second embodiment, when sampling a personal computer signal or the like, a clearer image can be obtained, and further, only the sampling clock of the ADC 43, i.e., the clock for sampling the video signal, can be phase-shifted, whereby disturbance at phase change can be suppressed. Further, this circuit can be realized by replacing the originally used analog PLL with the multiple-phase output analog PLL, thereby reducing the area of a semiconductor device or the like when the circuit is incorporated in the semiconductor device.

Embodiment 6

Figure 15:
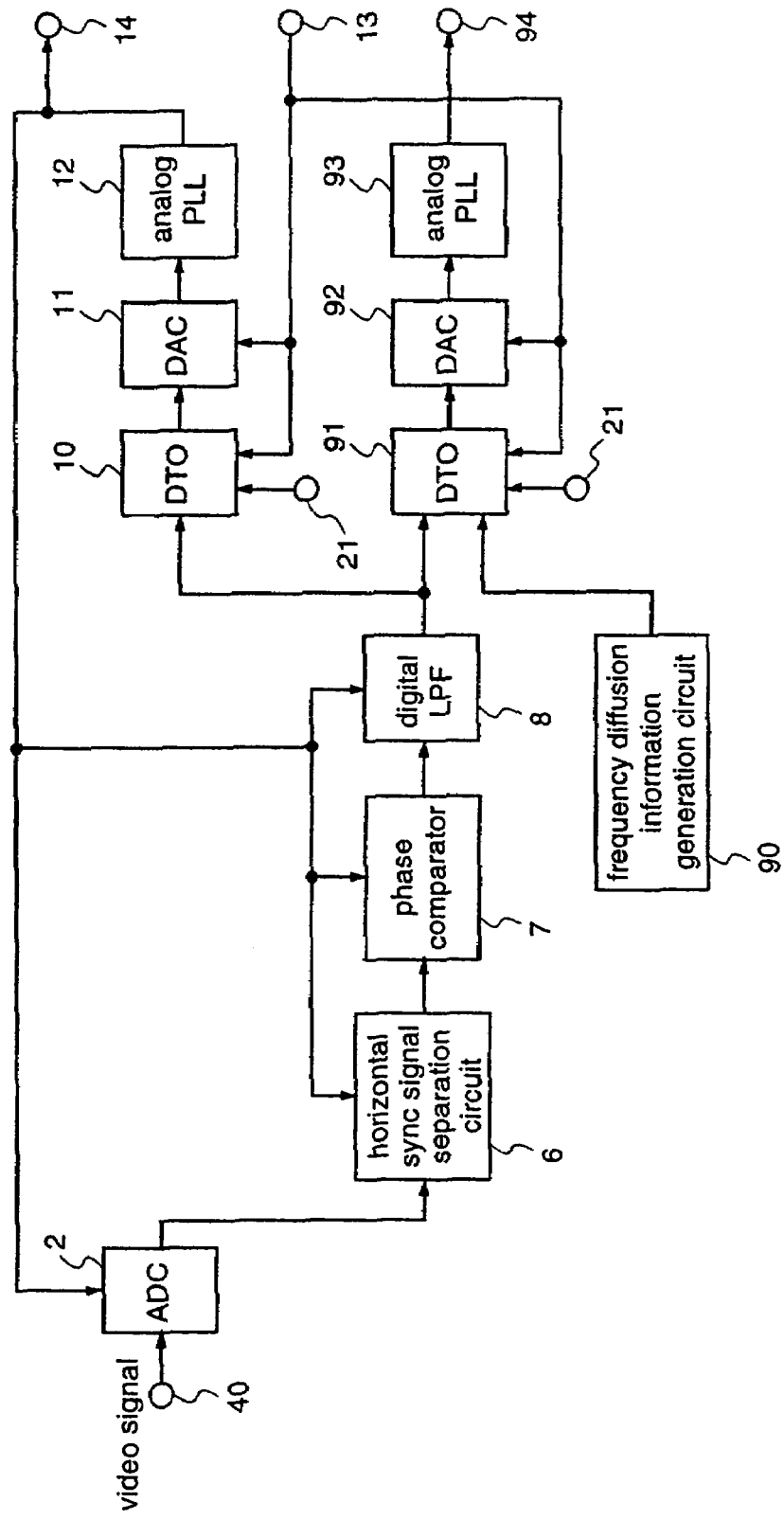
FIG. 15 is a block diagram illustrating the construction of a clock generation apparatus according to a sixth embodiment of the present invention.

FIG. 15 is a block diagram illustrating the construction of a clock generation apparatus according to a sixth embodiment of the present invention. In FIG. 15, the same reference numerals as those shown in FIG. 5 denote the same or corresponding parts, and reference numeral 90 denotes a frequency spread information generation circuit, 91 denotes a DTO, 92 denotes a DAC, 93 denotes an analog PLL, and 94 denotes a clock output terminal.

Hereinafter, the operation of the clock generation apparatus according to the sixth embodiment will be described with reference to the drawings. Initially, the operation of the circuit comprising the ADC 2, the horizontal sync signal separation circuit 6, the phase comparator 7, the digital LPF 8, the DTO 10, the DAC 11, the analog PLL 12, the MCK input terminal 13, and the signal input terminal 40 is identical to the operation of the corresponding part of the clock generation apparatus according to the second embodiment. The clock generation apparatus according to the sixth embodiment is provided with the frequency spread information generation circuit 90 to generate frequency spread information, and the second DTO 91 and the second DAC 92 generate a sinusoidal wave on the basis of the phase error information and the frequency spread information which are outputted from the digital LPF 8, and then the sinusoidal wave is multiplied, thereby outputting a frequency-spread clock from the clock output terminal 94.

Figure 16:
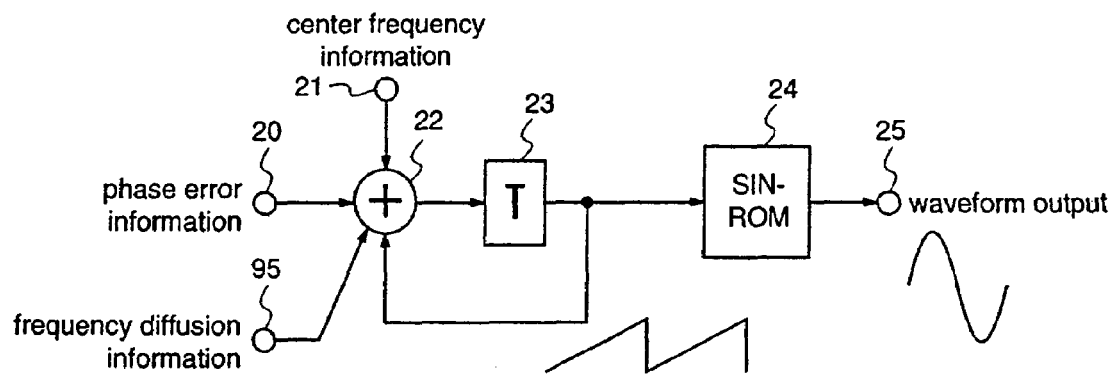
FIG. 16 is a block diagram illustrating the construction of a DTO 91 shown in FIG. 15.

FIG. 16 is a block diagram illustrating the construction of the DTO 91 used in the clock generation apparatus according to the sixth embodiment. In FIG. 16, reference numeral 20 denotes a phase error information input terminal, 21 denotes a center frequency information input terminal, 22 denotes an adder, 23 denotes a flop-flop, 24 denotes a SIN-ROM, and 25 denotes a waveform output terminal. These constituents are identical to those of the DTO according to the first embodiment. Further, reference numeral 95 denotes a frequency spread information input terminal. Hereinafter, the operation of the DTO 91 will be described. The operations of the phase error information input terminal 20, the center frequency information input terminal 21, the adder 22, the flip-flop 23, the SIN-ROM 24, and the waveform output terminal 25 are identical to those of the DTO 10 according to the first embodiment. The frequency spread information is inputted from the frequency spread information input terminal 95, and the center frequency information and the phase error information are added to the frequency spread information by the adder 22. Further, by adding the frequency spread information using the adder 22, the circuit can be easily digitized, thereby incorporation of the circuit into a semiconductor device or the like can be facilitated.

Figure 17:
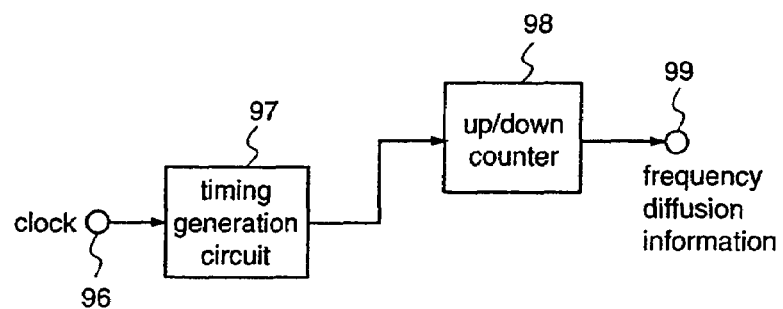
FIG. 17 is a block diagram illustrating the construction of a frequency spread information generation circuit 90 shown in FIG. 15.
Figure 18:
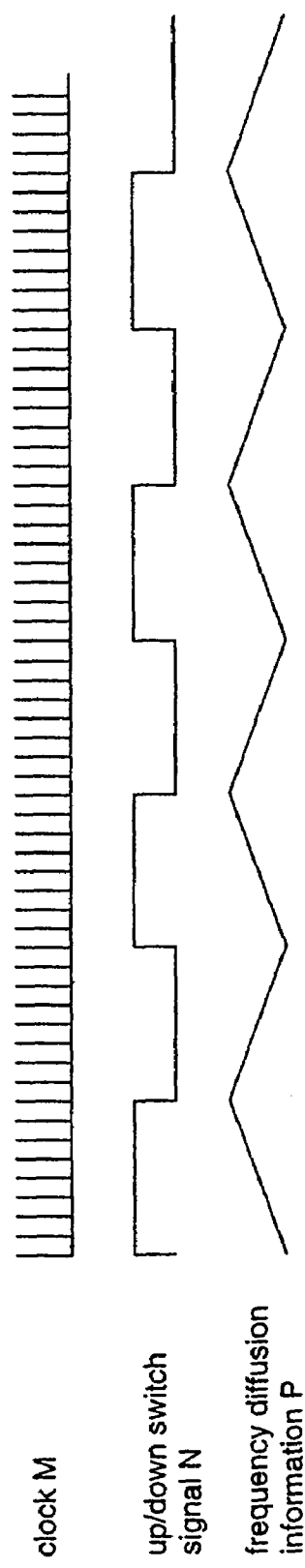
FIG. 18 is a timing chart for explaining the operation of the frequency spread information generation circuit 90.

FIG. 17 is a block diagram illustrating the construction of the frequency spread information generation circuit 90 included in the clock generation apparatus according to the sixth embodiment. FIG. 18 is a timing waveform diagram of the frequency spread information generation circuit 90. In FIG. 17, reference numeral 96 denotes a clock input terminal, 97 denotes a timing generation circuit, 98 denotes an Up/Down counter, and 99 denotes a frequency spread information output terminal.

Hereinafter, the operation of the frequency spread information generation circuit 90 will be described. A clock is inputted through the clock input terminal 96, and a timing for making frequency spread information is generated by the timing generation circuit 97. In this sixth embodiment, a clock whose frequency is divided (frequency divided clock) is generated like an Up/Down switch signal N. The frequency spread information P can be generated by performing addition and subtraction with the Up/Down counter 98 according to the logic values "1" and "0" of the frequency divided clock. This waveform is outputted from the frequency spread information output terminal 99, and the frequency can be spread so that the frequency is heightened at the rising edge of the frequency spread information P and lowered at the falling edge thereof. Thus, the frequency spread information generation circuit 90 is composed of only the frequency division circuit and the Up/Down counter to facilitate incorporation of the circuit into a semiconductor device or the like.

As described above, the clock generation apparatus according to the sixth embodiment is provided with the frequency spread information generation circuit 90 to generate a clock including frequency spread information, and the frequency spread clock is used for a system, whereby interference of the clock frequency which has conventionally occurred can be frequency spread, resulting in a reduction in interference at a specific frequency. Further, the digital frequency spread information generated by the timing generation circuit 97 and the Up/Down counter 98 is added as an input to the DTO 91, whereby control can be carried out with digital data, and addition of arbitrary spread information is facilitated.

Embodiment 7

Figure 19:
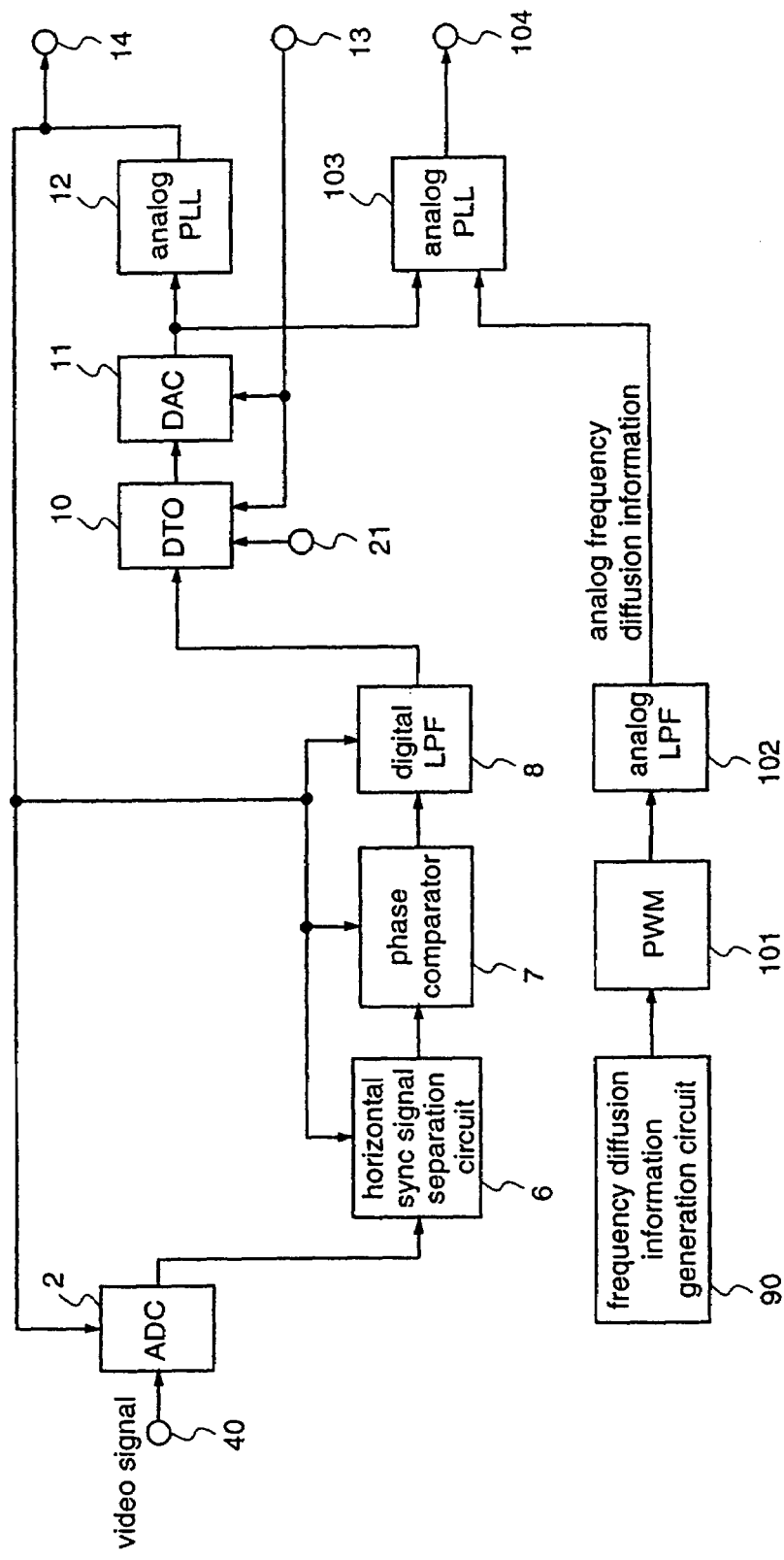
FIG. 19 is a block diagram illustrating the construction of a clock generation apparatus according to a seventh embodiment of the present invention.

FIG. 19 is a block diagram illustrating the construction of a clock generation apparatus according to a seventh embodiment of the present invention. In FIG. 19, the same reference numerals as those shown in FIG. 15 denote the same or corresponding parts, and reference numeral 101 denotes a PWM, 102 denotes an analog LPF, 103 denotes an analog PLL, and 104 denotes a clock output terminal.

Hereinafter, the operation of the clock generation apparatus according to the seventh embodiment will be described with reference to the drawings. Initially, the operation of the circuit comprising the ADC 2, the horizontal sync signal separation circuit 6, the phase comparator 7, the digital LPF 8, the DTO 10, the DAC 11, the MCK input terminal 13, the signal input terminal 40, the clock output terminal 14, and the frequency spread information generation circuit 90 is identical to the operation of the corresponding part of the clock generation apparatus according to the sixth embodiment. In the clock generation apparatus according to the seventh embodiment, frequency spread information generated in the frequency spread information generation circuit 90 is converted into an analog value by the PWM 101 and the analog LPF 102. This analog value is added to the analog PLL 103 to generate a frequency spread clock from the analog PLL 103, and the frequency spread clock is outputted from the clock output terminal 104.

Figure 20:
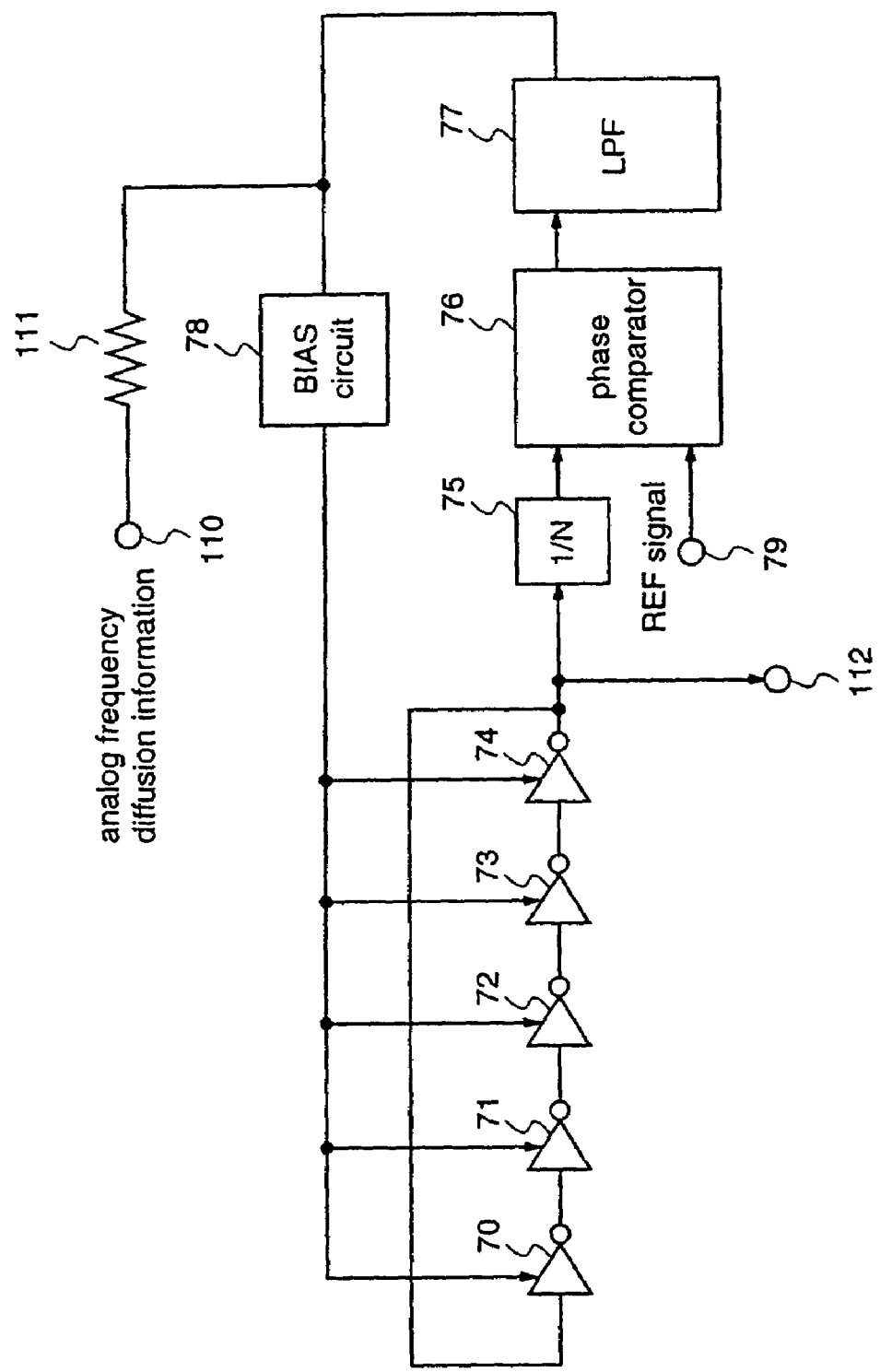
FIG. 20 is a block diagram illustrating the construction of an analog PLL 103 shown in FIG. 19.

FIG. 20 is a block diagram illustrating the analog PLL 103 of the clock generation apparatus according to the seventh embodiment. In FIG. 20, reference numerals 70 to 74 denote inversion delay elements, 75 denotes a frequency division circuit, 76 denotes a phase comparator, 77 denotes an LPF, 78 denotes a bias circuit, and 79 denotes an REF signal input terminal. These constituents are identical to those of the multiple-phase output analog PLL 65 according to the fifth embodiment. Further, reference numeral 110 denotes an analog frequency spread information input terminal, 111 denotes a resistor, and 112 denotes a clock output terminal.

Hereinafter, the operation of the analog PLL 103 will be described. The operations of the inversion delay elements 70 to 74, the frequency division circuit 75, the phase comparator 76, the LPF 77, the bias circuit 78, and the REF signal input terminal 79 are identical to the operations of those of the multiple-phase output analog PLL 65 according to the fifth embodiment.

In this seventh embodiment, analog frequency spread information outputted from the analog LPF 102 is received by the analog frequency spread information input terminal 110, and added to the output of the LPF 77 through the resistor 111, whereby a voltage that controls the inversion delay elements 70 to 74 slightly varies, and a frequency spread clock can be output from the clock output terminal 112.

As described above, since the clock generation apparatus according to the seventh embodiment is provided with the frequency spread information generation circuit 90, the PWM 101, and the analog LPF 102, it is possible to generate analog value frequency spread information. By applying, to a system, a clock that is frequency spread using this frequency spread information, interference of clock frequency which has conventionally occurred can also be frequency spread. Further, since the PWM 101 and the analog LPF 102 are provided to generate analog value frequency spread information, the second DAC in the second DTO used in the clock generation apparatus according to the sixth embodiment can be dispensed with.

Embodiment 8

Figure 21:
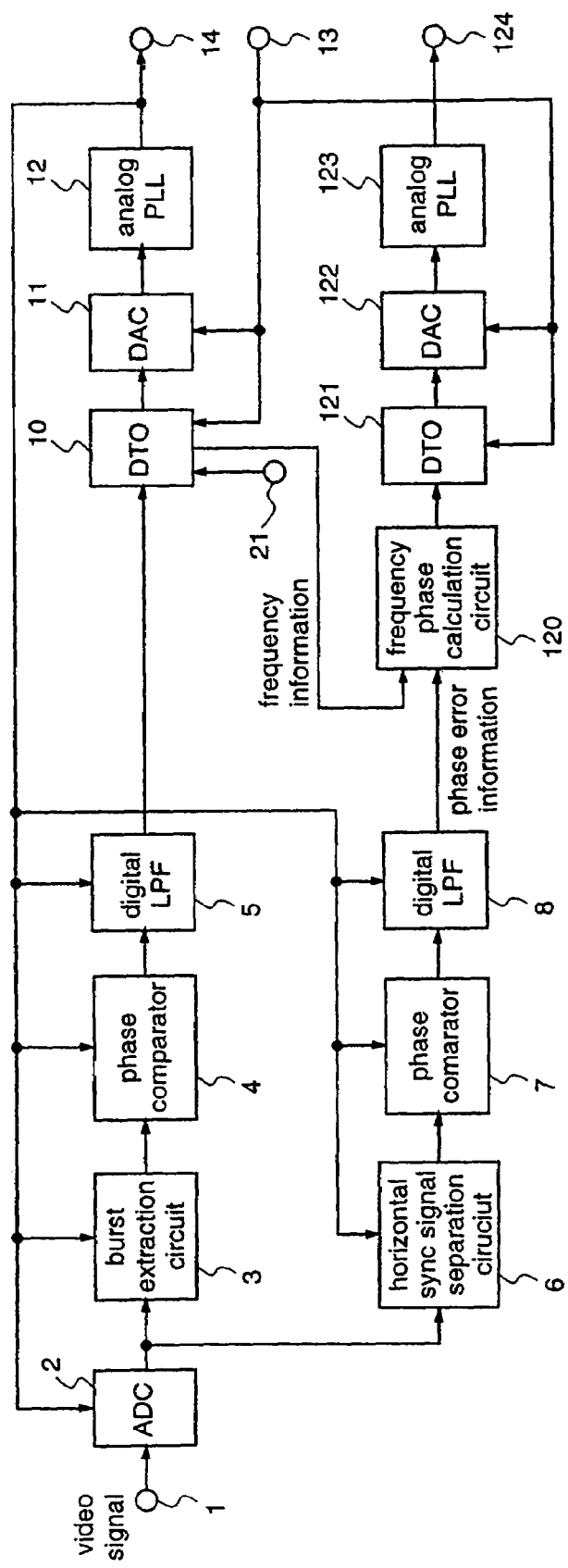
FIG. 21 is a block diagram illustrating the construction of a clock generation apparatus according to an eighth embodiment of the present invention.

FIG. 21 is a block diagram illustrating the construction of a clock generation apparatus according to an eighth embodiment of the present invention. In FIG. 21, the same reference numerals as those shown in FIG. 1 denote the same or corresponding parts, and reference numeral 120 denotes a frequency phase calculation circuit, 121 denotes a DTO, 122 denotes a DAC, 123 denotes an analog PLL, and 124 denotes a clock output terminal.

Hereinafter, the operation of the clock generation apparatus according to the eighth embodiment will be described with reference to the drawings. The operation of the circuit comprising the video signal input terminal 1, the ADC 2, the burst extraction circuit 3, the phase comparator 7, the digital LPF 8, the DTO 10, the DAC 11, the analog PLL 12, the MCK input terminal 13, and the clock output terminal 14 is identical to the operation of the corresponding part of the clock generation apparatus according to the first embodiment.

In the clock generation apparatus according to the eighth embodiment, frequency information (burst lock clock frequency information) of the DTO 10 and phase error information of a clock with respect to a horizontal sync signal outputted from the digital LPF 8 are calculated by the frequency phase calculation circuit 120 to output frequency information and phase information which are needed to generate a clock synchronized with the horizontal sync signal in the DTO 121, and a sinusoidal wave is generated by the DTO 121 and the DAC 122. The sinusoidal wave is multiplied by the analog PLL 123, whereby a desired line lock clock can be outputted from the clock output terminal 124. Therefore, both of the burst lock clock and the line lock clock can be simultaneously generated with the stable digital PLL, using only one ADC, whereby a clock synchronized with the burst signal and a clock synchronized with the horizontal sync signal can be simultaneously generated without using a high multiplication analog PLL that is sensitive to noise, even when a burst lock clock is needed for an input system and a line lock clock is needed for a display system, like a liquid crystal television or the like.

Figure 22:
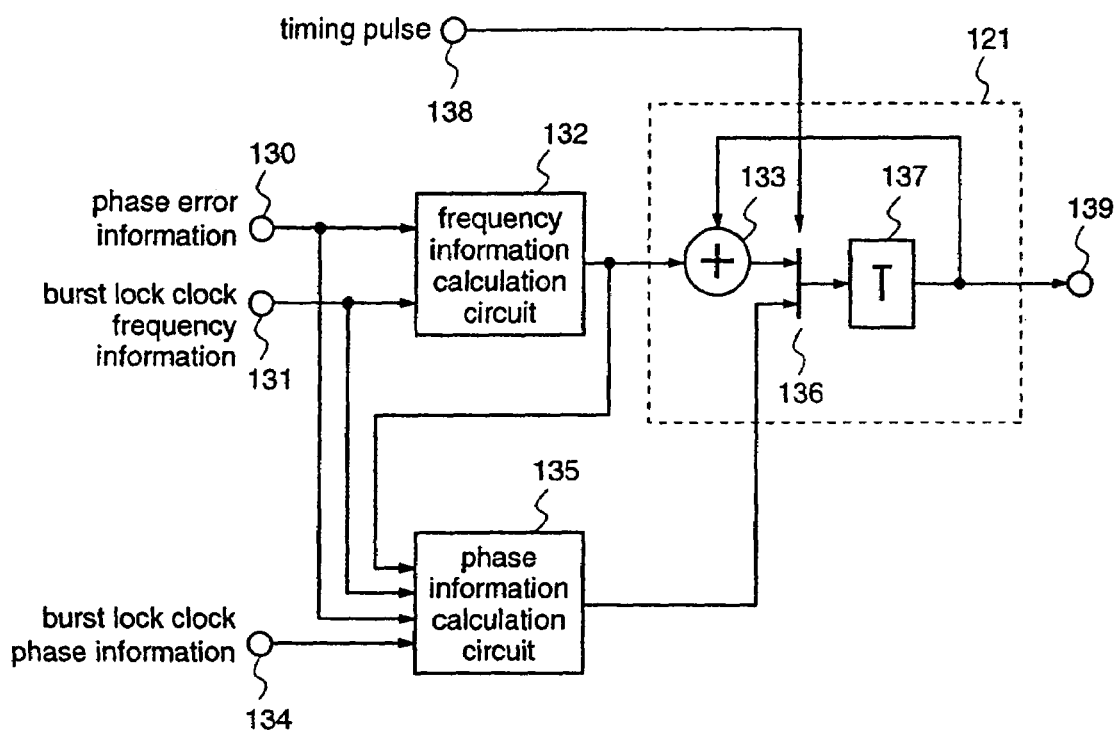
FIG. 22 is a simple block diagram illustrating the constructions of a frequency phase calculation circuit 120 and a DTO 121 shown in FIG. 21.
Figure 23:
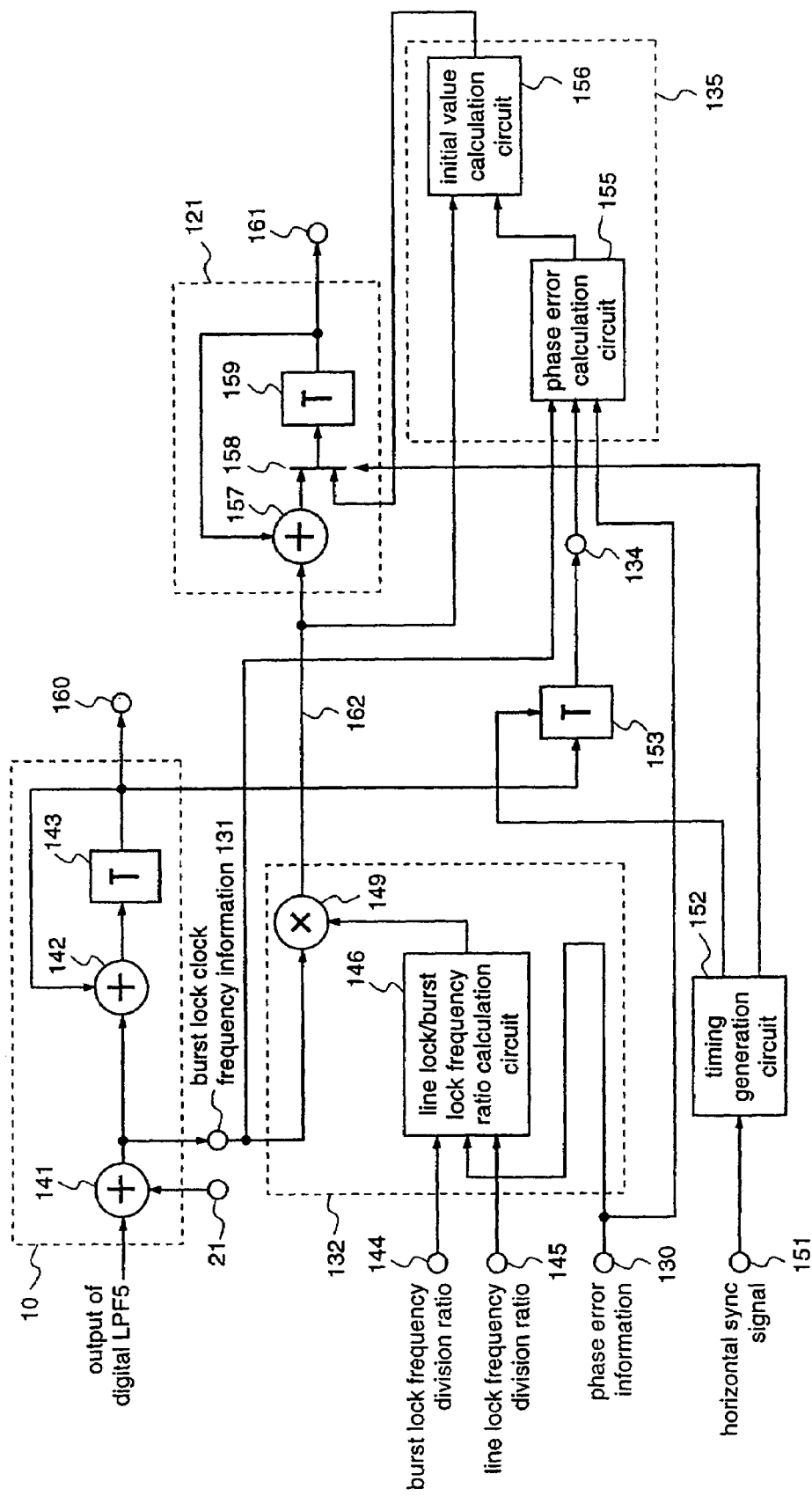
FIG. 23 is a block diagram specifically illustrating the constructions of the frequency phase calculation circuit 120 and the DTO 121 including a DTO 10.
Figure 24:
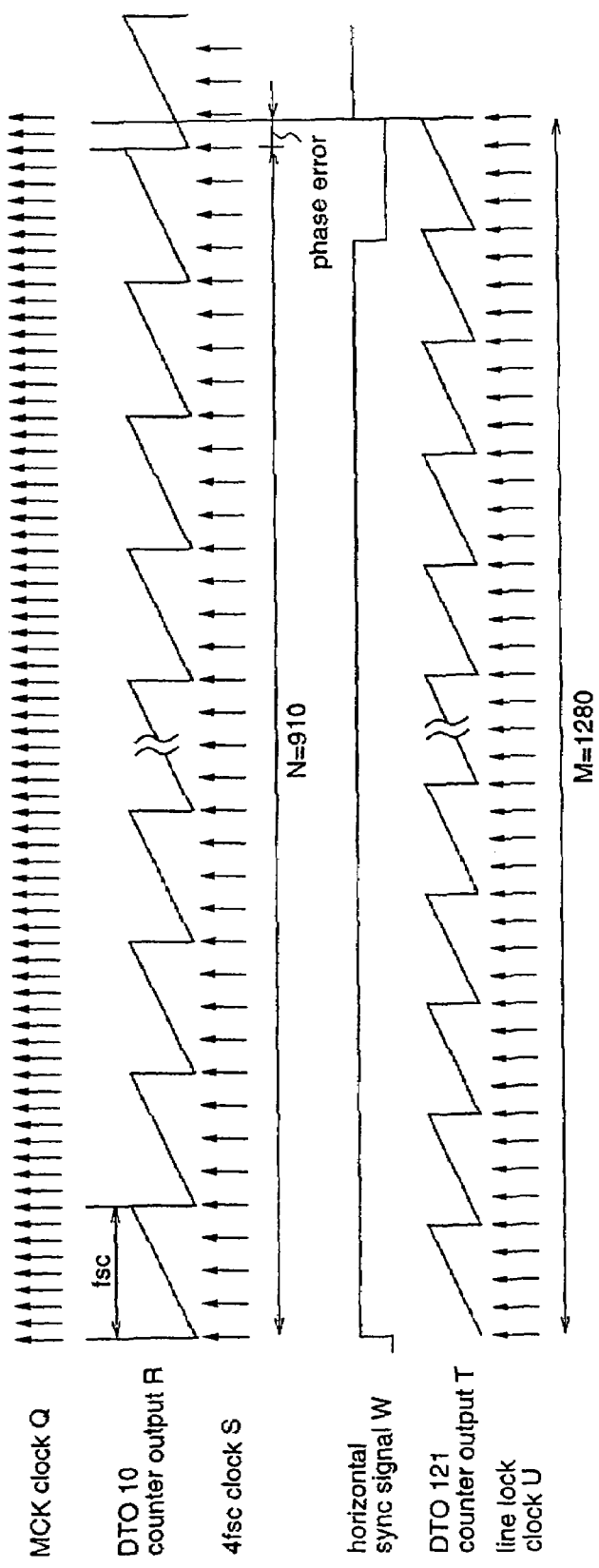
FIG. 24 is a waveform diagram for explaining the conception of a frequency calculation method in the clock generation apparatus according to the eighth embodiment.
Figure 25:
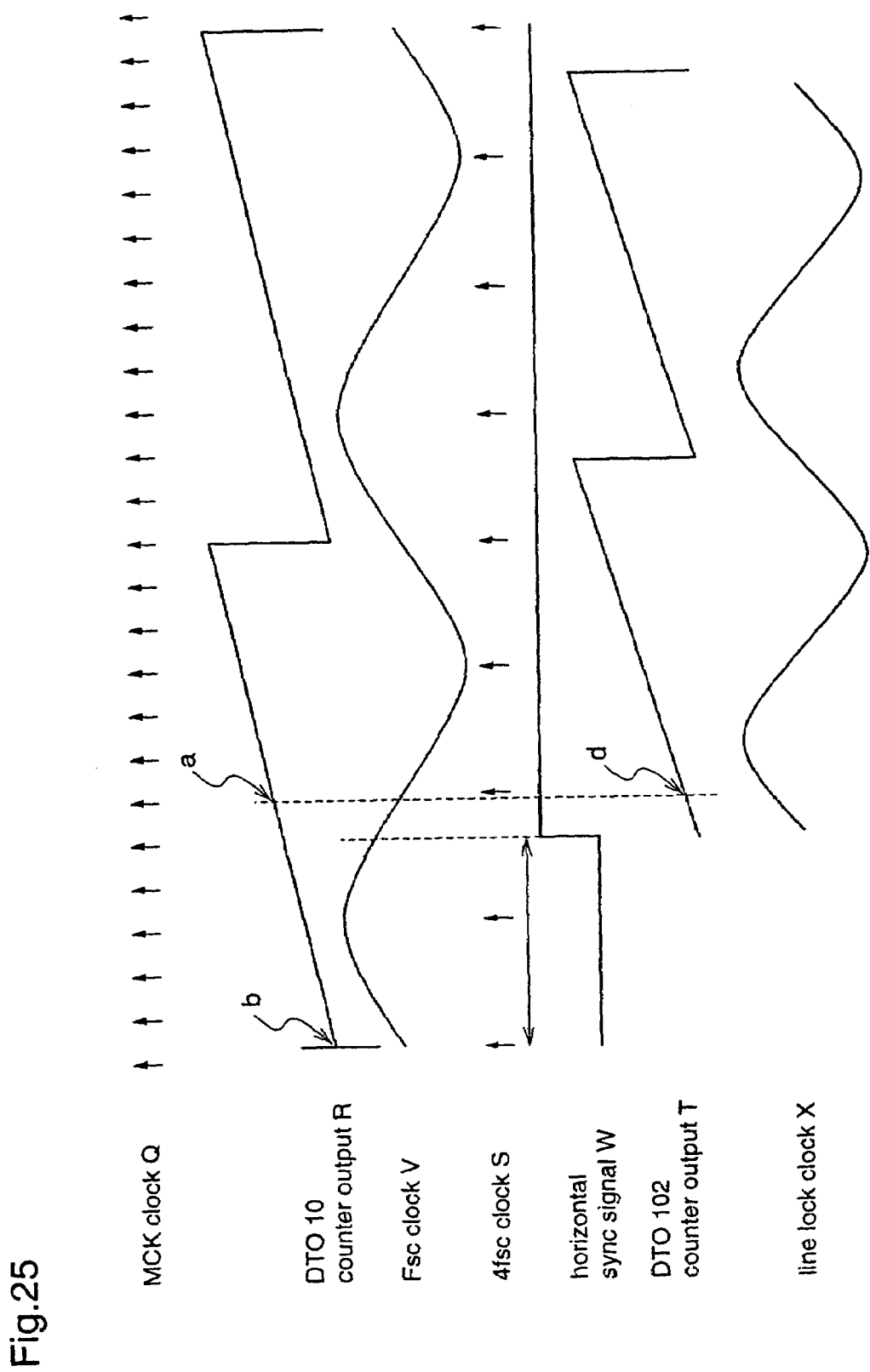
FIG. 25 is a waveform diagram for explaining a phase information calculation method in the clock generation apparatus according to the eighth embodiment.

FIG. 22 is a simple block diagram illustrating the frequency phase calculation circuit 120 and the DTO 121 in the clock generation apparatus according to the eighth embodiment. Further, FIG. 23 is a detailed block diagram including the frequency phase calculation circuit 120 and the DTO 121 including the DTO 10. FIG. 24 is a waveform diagram for explaining the conception of a frequency calculation method. FIG. 25 is a waveform diagram for explaining a phase information calculation method. In these figures, reference numeral 130 denotes a phase error information input terminal, 131 denotes a burst lock clock frequency information input terminal, 132 denotes a frequency information calculation circuit, 133 denotes an adder, 134 denotes a burst lock clock phase information input terminal, 135 denotes a phase information calculation circuit, 136 denotes a selector, 137 denotes a flip-flop, 138 denotes a timing pulse input terminal, and 139 denotes an output terminal.

Hereinafter, the operation of the frequency phase calculation circuit 120 will be described with reference to the drawings. In this eighth embodiment, a description will be given of an NTSC system television signal that is used in Japan and North America. It is assumed that a burst lock clock is 4 multiplication of a burst, a line lock clock is 1280 multiplication of the horizontal sync signal, and each of the analog PLL 12 and the analog PLL 123 performs 4 multiplication. The frequency of the DTO 121 comprising the adder 133, the selector 136, and the flip-flop 137 depends on the frequency of the burst lock clock, the number of the burst lock clocks during one horizontal sync period, the cycle of the horizontal sync signal that is obtained on the basis of the phase error information within one clock, and the number of multiplication to be oscillated by the digital PLL. In this eighth embodiment, the frequency of the burst lock clock, the number of the burst lock clocks in one horizontal sync period, and the phase error information within one clock are input to the frequency information calculation circuit 132. The cycle of the horizontal sync signal is obtained as follows.

{cycle of horizontal sync signal=(number of burst lock clocks in one horizontal sync period+phase error information within one clock)×cycle of burst lock clock}

Therefore, the cycle of the line lock clock is obtained by {cycle of line lock clock=cycle of horizontal sync signal/number of multiplication of the line lock clock}.

Accordingly, a clock of a desired frequency can be oscillated by performing these calculations with the frequency information calculation circuit 132 to obtain frequency information to the DTO 121. Further, the phase information calculation circuit 135 calculates phase information that is needed to perform phase matching required for line lock. Phase matching with the horizontal sync signal is carried out using the burst lock clock frequency information, the burst lock clock phase information, the phase error information between the burst lock clock and the horizontal sync signal, and the line lock clock frequency information that is calculated by the frequency information calculation circuit 132. A phase error from a clock (mater clock) to be used by the DTO 10 that generates a burst lock clock can be calculated on the basis of the burst lock clock frequency information and the burst lock clock phase information. A phase error of the DTO 121 that generates a line lock clock is calculated using the calculated phase error, the line lock clock frequency information calculated by the frequency information calculation circuit 132, and the phase error information (output of the digital LPF) between the burst lock clock and the horizontal sync signal, and the selector 136 is controlled with a timing pulse that is outputted one time during the horizontal period from the timing pulse input circuit, and an initial value is inputted with the result obtained by the phase information calculation circuit 135, thereby performing phase matching.

The operation of the frequency phase calculation circuit 120 according to the eighth embodiment will be further described with reference to FIGS. 23, 24, and 25. In FIG. 23, reference numeral 10 denotes a burst lock DTO, 121 denotes a line lock DTO, 130 denotes an input terminal for phase error information between the burst lock clock and the horizontal sync signal, 131 denotes a burst lock clock frequency information input terminal, 132 denotes a frequency information calculation circuit, 135 denotes a phase information calculation circuit, 141 and 142 denote adders, 143 denotes a flip-flop, 144 denotes a burst lock frequency-division ratio input terminal, 145 denotes a line lock frequency-division ratio input terminal, 146 denotes a line lock/burst lock frequency ratio calculation circuit, 149 denotes a multiplier, 151 denotes a horizontal sync signal input terminal, 152 denotes a timing generation circuit, 153 denotes a flip-flop, 155 denotes a phase error calculation circuit, 156 denotes an initial value calculation circuit, 157 denotes an adder, 158 denotes a switch, 159 denotes a flip-flop, 160 denotes a burst lock sawtooth wave output terminal, 161 denotes a line lock sawtooth wave output terminal, and 162 denotes line lock clock frequency information. In FIG. 24, Q shows a MCK clock, R shows a sawtooth wave outputted from the adder of the DTO 10, S shows a 4fs clock that is obtained by multiplying the output of the DTO 10 with the analog PLL 12, W shows a horizontal sync signal, T shows a sawtooth wave outputted from the adder of the DTO 121, and U shows a line lock clock that is obtained by multiplying the output of the DTO 121 with the analog PLL 123. In FIG. 25, Q, R, S, W, and T are identical to those shown in FIG. 24, and V shows a sinusoidal wave outputted from the DTO 10, and X shows a line lock clock before multiplication.

The frequency information calculation circuit 132 receives the number of the burst lock clocks during one horizontal sync period from the burst lock frequency-division ratio input terminal 144, the frequency of the burst lock clock from the burst lock frequency information input terminal 131, the phase error information within one clock from the phase error information input terminal 130, and the frequency-division ratio of the line lock clock to be output, from the line lock frequency-division ratio input terminal 145. The number of the burst lock clocks during one horizontal sync period that is inputted from the burst lock frequency-division ratio input terminal 144 is obtained on the basis of the horizontal sync signal extracted by the horizontal sync signal separation circuit 6, and the center frequency information of the burst lock clock which is a fixed value. The frequency of the burst lock clock that is inputted from the burst lock frequency information input terminal 131 is obtained by adding the output of the digital LPF 5 and the center frequency information of the burst lock clock by the adder 141. Since the cycle of the burst lock clock is identical to the cycle of the sawtooth wave outputted from the counter (flip-flop 143) of the DTO 10, the burst lock clock is shown as the sawtooth wave of the DTO 10 in FIG. 24. As shown in FIG. 24, a factor k with which the frequency of the line lock clock is calculated by multiplying the burst lock clock by k is obtained as follows, using the number of sawtooth waves within one cycle of the horizontal sync signal, the phase error from the horizontal sync signal, and the frequency division ratio of the line lock clock to be output.

$k$={(number of burst lock clocks in one horizontal sync period+phase error information within one clock)/frequency division ratio of line lock clock to be output}

By calculating, with the multiplier 149, the factor k and the burst lock clock frequency information that is inputted from the burst lock frequency information input terminal 131, line lock clock frequency information 162 is obtained as an output of the multiplier 149. The above-mentioned construction enables frequency matching using only calculation, thereby providing a stable PLL. Further, the PLL can be constructed by only the arithmetic elements of four arithmetic operations, latch, and simple logic circuit, and therefore, the PLL can easily be mounted on an integrated circuit.

Further, the operation of the phase information calculation circuit 135 will be described with reference to FIG. 25. It is possible to obtain a phase difference between the burst lock clock and the MCK clock on the basis of the phase error information inputted through the phase error information input terminal 130, and the output value of the counter in the DTO 10 at an edge (point a) of the MCK clock after a change point of the horizontal sync signal. The 0 point of the fsc clock (point b) is synchronized with the 0 point of the counter output of the DTO 10 and, therefore, these 0 points match. Accordingly, since gradient of the sawtooth wave of the counter of the DTO 10 is obtained from the burst lock clock frequency information, a phase difference between the burst lock clock and the MCK clock can be obtained as follows using the phase error information inputted through the information input terminal 130 and the output value of the counter of the DTO 10 at point a:

{phase difference between burst lock clock and MCK clock}={(output value from counter of DTO 10 at point a/burst lock clock frequency information)−phase error information inputted from information input terminal 130}

Further, since the line lock clock frequency information 162 is obtained by the frequency information calculation circuit 132, a value at point d of the counter output of the DTO 102, i.e., a value for initializing the DTO 121 can be obtained as follows.

{value of counter output of DTO 102 at point d}={line lock clock frequency information 162× (phase difference between burst lock clock and MCK clock)}

Accordingly, in the phase information calculation circuit 135, a phase difference between the MCK clock and the burst lock is calculated by inputting the phase error information between the burst lock clock and the horizontal sync signal, which is supplied from the phase error information terminal 130, to the phase error calculation circuit 155, inputting the burst lock clock frequency information supplied through the burst lock clock frequency information input terminal 131, inputting the horizontal sync signal through the horizontal sync signal input terminal 151, extracting the rising edge in the timing generation circuit 152, and inputting the phase information of the burst lock clock that is outputted from the burst lock DTO 10 by the MCK immediately after the rising edge. The output of the phase error calculation circuit 155 and the line lock clock frequency information 162 are inputted to the initial value calculation circuit 156 and calculated, whereby an initial value for initializing the line lock DTO 121 can be calculated. Then, using the calculated value, the line lock DTO 121 is initialized at a timing synchronized with the horizontal sync signal, which is generated by the timing generation circuit 152, whereby the phase of the line lock clock generated by the line lock DTO 121 can be synchronized with the phase of the horizontal sync signal. Thereby, phase matching can be achieved by only arithmetic operations, resulting in a stable PLL. The circuit used in this eighth embodiment can be constituted by the arithmetic elements of four arithmetic operations, latch, and simple logic circuit, and therefore, it can be easily mounted on an integrated circuit.

As described above, the clock generation apparatus according to the eighth embodiment is provided with a circuit for generating a clock synchronized with the burst signal, which comprises the burst extraction circuit 3, the first phase comparator 4, the first digital LPF 5, the first DTO 10, the DAC 11, and the first PLL 12, and a circuit for generating a clock synchronized with the horizontal sync signal, which comprises the horizontal sync signal separation circuit 6, the second phase comparator 7, the second digital LPF 8, the frequency phase calculation circuit 120, the second DTO 121, the second DAC 122, and the second PLL 123. Therefore, it is possible to realize a clock generation apparatus which can simultaneously generate a clock synchronized with the burst signal and a clock synchronized with the horizontal sync signal, which are required in a system such as a liquid crystal television or the like.

Further, in the clock generation apparatus according to the eighth embodiment, the frequency phase calculation circuit 120 is provided with the line lock clock frequency information generation circuit 132 which receives the phase error information of the burst lock clock as an output of the second digital LPF 8, and the frequency information of the burst lock clock of the first DTO 10; and the line lock clock phase information generation circuit 135 which receives the frequency information of the line lock clock as an output of the line lock clock frequency information generation circuit 132, the phase information of the burst lock clock of the first DTO 10, the frequency information of the burst lock clock, and the phase error information of the burst lock clock. Therefore, the frequency information and phase information required for the line lock can be calculated using only digital data, whereby a stable system can be set up.

Further, in the clock generation apparatus according to the eighth embodiment, the line lock clock frequency information generation circuit 132 is provided with the line lock/burst lock frequency ratio calculation circuit 146 which receives the frequency division ratio of the burst lock clock to the horizontal sync signal during the standard operation, the frequency division ratio of the line lock clock to the horizontal sync signal during the standard operation, and the phase difference between the signal obtained by frequency dividing the clock during the burst lock clock standard operation and the actual horizontal sync signal, and calculates the ratio of frequencies between the signal obtained by frequency dividing the clock and the actual horizontal sync signal; and the multiplier 149 which multiplies the frequency information of the burst lock by the frequency ratio that is calculated by the line lock/burst lock frequency ratio calculation circuit 146 to output the frequency information of the line lock. Therefore, the frequency information can be generated by the ratio operation and the operation of multiplying the factor obtained by the ratio operation, whereby the clock generation apparatus can easily be incorporated in a digital circuit.

Furthermore, in the clock generation apparatus according to the eighth embodiment, the line lock phase information generation circuit 135 is provided with the timing generation circuit 152 which generates a timing to set the initial value of the second DTO that generates a line lock clock and a timing to capture such as the phase information of the burst lock clock; the line lock/burst lock frequency ratio calculation circuit 155 which calculates the ratio of frequencies from the burst lock frequency information and the line lock frequency information; and the initial value calculation circuit 156 which calculates the initial value of the second DTO that generates a line lock clock on the basis of the phase difference between the signal obtained by frequency dividing the clock during the burst lock clock standard operation and the actual horizontal sync signal, and the frequency ratio obtained by the line lock/burst lock frequency ratio calculation circuit. Therefore, the cycle information of the DTO and the phase information of the DTO for the burst lock and line lock can be obtained by four arithmetic operations, whereby the clock generation apparatus can easily be incorporated in a digital circuit.

Embodiment 9

Figure 26:
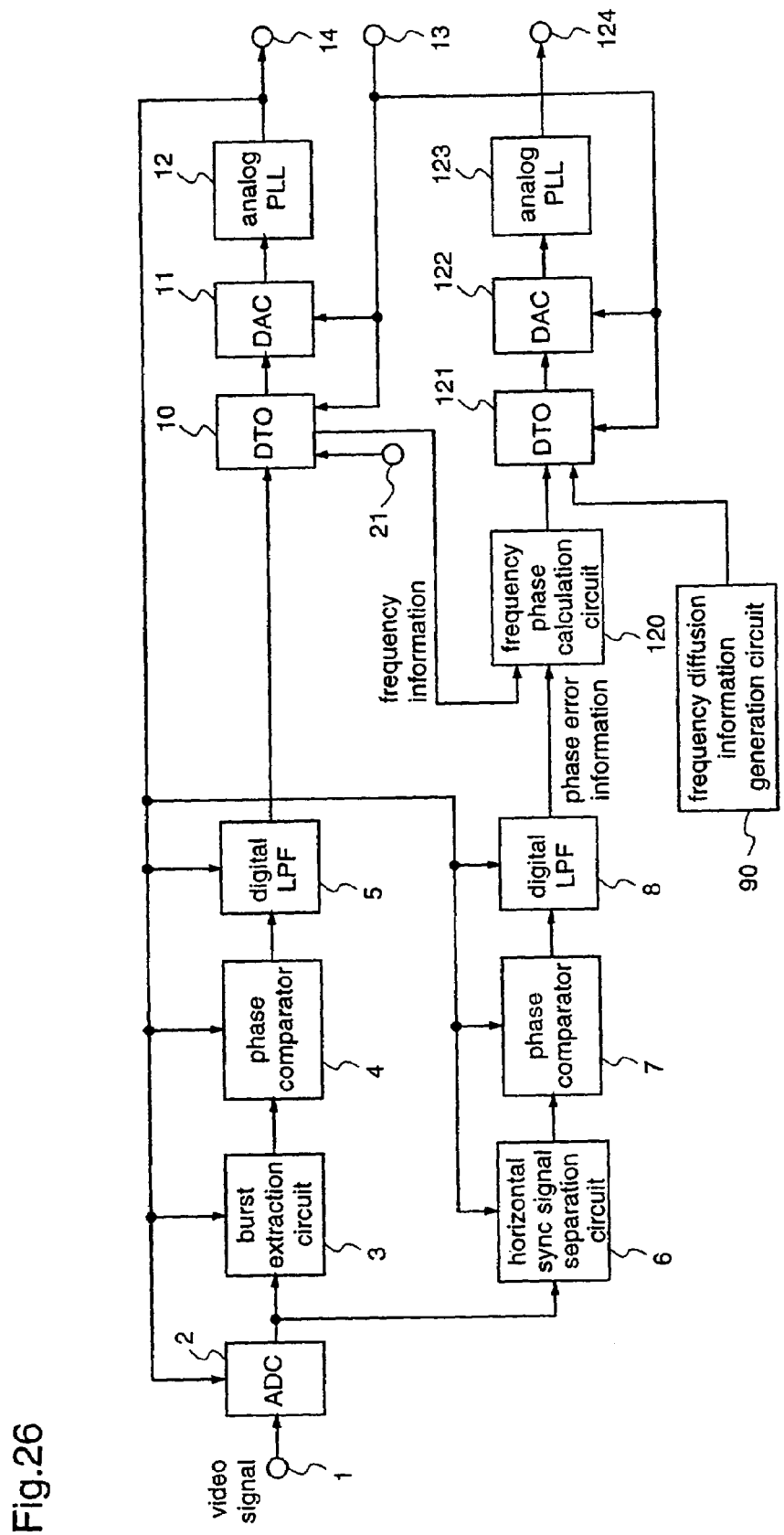
FIG. 26 is a block diagram illustrating the construction of a block diagram illustrating the construction of a clock generation apparatus according to a ninth embodiment of the present invention.

FIG. 26 is a block diagram illustrating the construction of a clock generation apparatus according to a ninth embodiment of the present invention. In FIG. 26, the same reference numerals as those shown in FIGS. 15 and 21 denote the same or corresponding parts.

Hereinafter, the operation of the clock generation apparatus according to the ninth embodiment will be described with reference to the drawings. The operation of the circuit comprising the video signal input terminal 1, the ADC 2, the burst extraction circuit 3, the phase comparator 4, the digital LPF 5, the horizontal sync signal separation circuit 6, the phase comparator 7, the digital LPF 8, the DTO 10, the DAC 11, the analog PLL 12, the MCK input terminal 13, the clock output terminal 14, the frequency phase calculation circuit 120, the DAC 122, the analog PLL 123, and the clock output terminal 124 is identical to the operation of the corresponding part of the clock generation apparatus according to the eighth embodiment. Further, the construction and operation of the frequency spread information generation circuit 90 are identical to those of the frequency spread information generation circuit 90 of the clock generation apparatus according to the sixth embodiment.

In this ninth embodiment, only the frequency of the line lock clock is spread by inputting the frequency spread information outputted from the frequency spread information generation circuit 90 into the DTO 121, and the frequency-spread clock is used in the system, whereby interference of clock frequency which has occurred conventionally can also be frequency spread, resulting in a reduction in interference at a specific frequency, and further, a reduction in vertical-striped interference that is specific to line lock.

Embodiment 10

Figure 27:
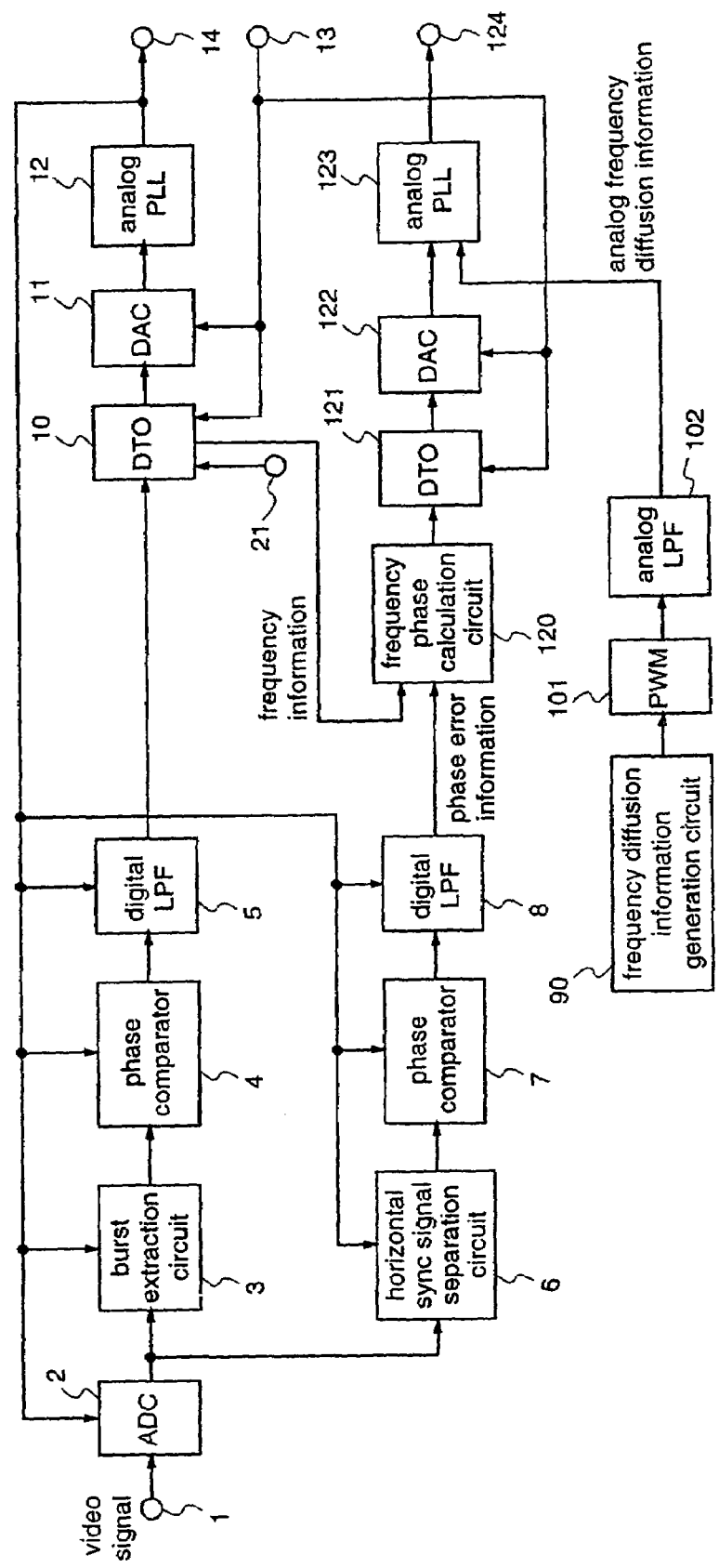
FIG. 27 is a block diagram illustrating the construction of a clock generation apparatus according to a tenth embodiment of the present invention.
Figure 28:
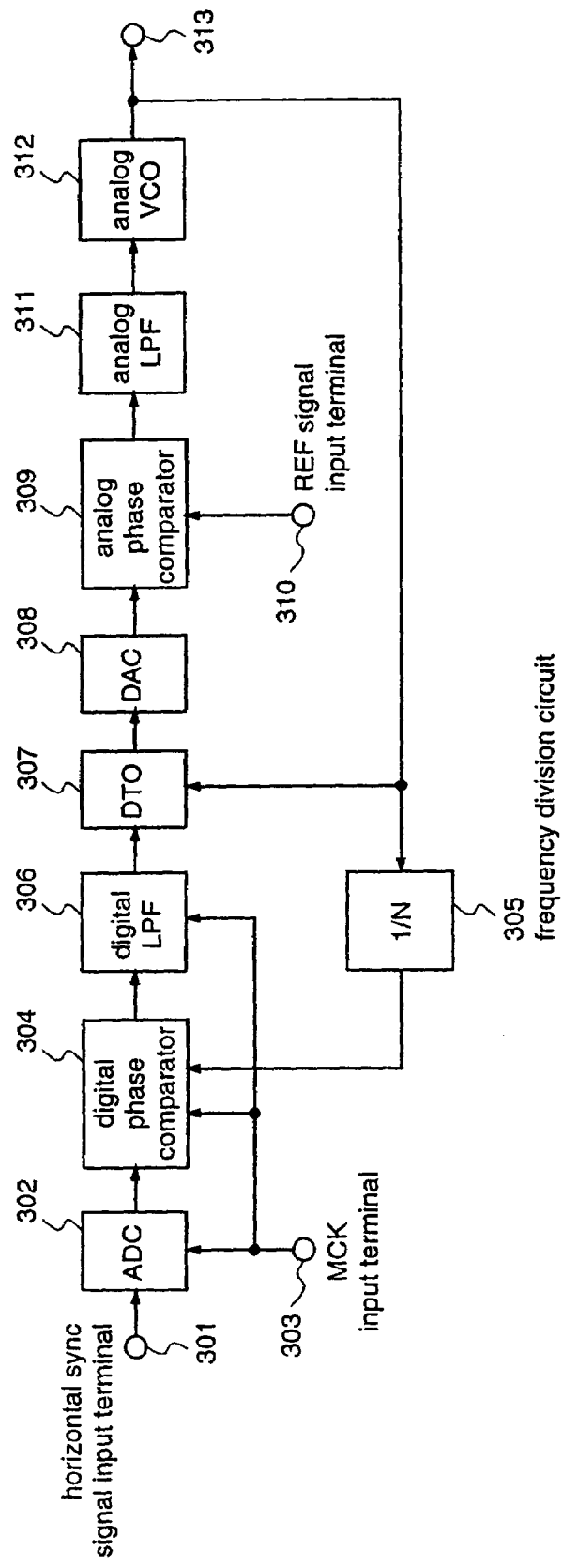
FIG. 28 is a block diagram illustrating the conventional clock generation apparatus.

FIG. 27 is a block diagram illustrating the construction of a clock generation apparatus according to a tenth embodiment of the present invention. In FIG. 27, the same reference numerals as those shown in FIGS. 19 and 21 denote the same or corresponding parts.

Hereinafter, the operation of the clock generation apparatus according to the tenth embodiment will be described with reference to the drawings. The operation of the circuit comprising the video signal input terminal 1, the ADC 2, the burst extraction circuit 3, the phase comparator 4, the digital LPF 5, the horizontal sync signal separation circuit 6, the phase comparator 7, the digital LPF 8, the DTO 10, the DAC 11, the analog PLL 12, the MCK input terminal 13, the clock output terminal 14, the frequency phase calculation circuit 120, the DAC 122, the analog PLL 123, and the clock output terminal 124 is identical to the operation of the corresponding part of the clock generation apparatus according to the eighth embodiment. Further, the constructions and operations of the frequency spread information generation circuit 90, the PWM 101, and the analog LPF 102 are identical to those of the frequency spread information generation circuit 90, the PWM 101, and the analog LPF 102 of the clock generation apparatus according to the seventh embodiment.

In this tenth embodiment, the frequency spread information outputted from the frequency spread information generation circuit 90 is converted into an analog value by the PWM 101 and the analog LPF 102 and the analog value is input to the voltage control terminal of the analog PLL, whereby only the frequency of the line lock clock is spread and the frequency spread clock is used in the system. Thereby, interference of clock frequency which has occurred conventionally can also be frequency spread, resulting in a reduction in interference at a specific frequency, and further, a reduction in vertical-striped interference that is specific to line lock.

APPLICABILITY IN INDUSTRY

The clock generation apparatus according to the present invention is provided with the first phase comparator for comparing the phase of the burst signal with the phase of the clock of the ADC and the first LPF, and the second phase comparator for comparing the phase of the horizontal sync signal with the phase of the clock and the second LPF, and either the first phase comparator or the second phase comparator is selected, whereby it becomes possible to generate clocks synchronized with various kinds of video signals, and therefore, the clock generation apparatus is useful for video signal processing of a television receiver or the like. Further, since the clock generation apparatus is provided with the stationary phase error addition circuit for generating a stationary phase error, the phase of a clock used for signal processing can be shifted, and a stable part of data of the video signal can be sampled by shifting the phase relationship between the clock to be sampled with the ADC and the horizontal sync signal, whereby a clear image can be obtained, and therefore, the clock generation apparatus is useful in a video receiver such as a television receiver or a personal computer. Further, since the phase relationship between the clock to be sampled by the ADC and the horizontal sync signal is shifted by changing the phase of the clock to be outputted using the DLL and the multiple phase output PLL, a stable part of data of the video signal can be sampled, whereby a clear image can be obtained, and therefore, the clock generation apparatus is useful in a video receiver such as a television receiver or a personal computer. Furthermore, since the clock generation apparatus is provided with the frequency spread information generation circuit, the frequency of the clock to be output can be consciously spread, whereby peaks of electromagnetic interference outputted from the clock can be reduced, and adverse effect of the clock to the video can be reduced in a television receiver or a personal computer monitor video receiver. Moreover, since the second DTO is operated using the phase error information of the first phase comparator, the frequency information of the first DTO, and the phase error information from the second phase comparator, it is possible to generate clocks synchronized with two signals such as a burst signal and a horizontal sync signal, respectively, using a single ADC, and therefore, the clock generation apparatus is useful in constituting a system that needs two clocks, such as a liquid crystal television receiver in recent years. Further, the above-mentioned constituents can be combined to realize the respective effects at the same time, and therefore, are useful for enhancement in picture quality of a television receiver or a monitor of a personal computer which deals with a video signal.

What is claimed is:

1. A clock generation circuit comprising:
   a first ADC for converting a video signal on which a sync signal is superimposed or a sync signal, which is inputted through a first video signal input terminal, into a digital signal, and outputting the digital signal;
   a second ADC for converting a video signal inputted through a second video signal input terminal into a digital signal, and outputting the digital signal;
   a horizontal sync signal separation circuit for receiving the video signal or sync signal that is digitized by the first ADC, and separating the horizontal sync signal from the signal;
   a phase comparator for comparing the phase of the horizontal sync signal that is separated by the horizontal sync signal separation circuit with the phase of a clock that operates the first ADC;
   a digital LPF for receiving the output of the phase comparator, and smoothing the output of the phase comparator to output phase error information;
   a DTO for receiving the phase error information outputted from the digital LPF, and outputting a digital timing signal that is generated at a timing according to the phase error information;
   a DAC for converting the digital timing signal outputted from the DTO into an analog signal, and outputting the analog signal;
   a multiple phase output PLL for multiplying the output of the DAC to supply a clock to the first ADC, and simultaneously, outputting an intermediate phase among the multiple phases; and
   a clock selection circuit for selecting one of the multiple phase clocks outputted from the multiple phase output PLL, and supplying the second ADC with the selected clock.

2. A clock generation apparatus as defined in claim 1 wherein
   said multiple phase output PLL comprises a ring oscillator comprising M stages of variable delay elements, a frequency divider for converting the frequency of the output of the ring oscillator to 1/K, a phase comparator for comparing the phase of the output from the frequency divider with the phase of an REF signal inputted through an REF signal input terminal, an LPF for receiving the output of the phase comparator, a bias circuit for receiving the output of the LPF, and controlling the delay values of the variable delay elements, and an output terminal for outputting the outputs of the M stages of variable delay elements.

* * * * *